United States Patent
Araki et al.

[11] Patent Number: 5,923,504
[45] Date of Patent: Jul. 13, 1999

[54] MAGNETORESISTANCE DEVICE

[75] Inventors: Satoru Araki; Yuichi Sato, both of Chiba; Osamu Shinoura, Ichikawa, all of Japan

[73] Assignee: TDK Corporation, Tokyo, Japan

[21] Appl. No.: 08/817,098

[22] PCT Filed: Sep. 19, 1996

[86] PCT No.: PCT/JP96/02702

§ 371 Date: Apr. 18, 1997

§ 102(e) Date: Apr. 18, 1997

[87] PCT Pub. No.: WO97/11499

PCT Pub. Date: Mar. 27, 1997

[30] Foreign Application Priority Data

Sep. 21, 1995 [JP] Japan .................................. 7-267768

[51] Int. Cl.[6] .................................................. G11B 5/127
[52] U.S. Cl. .............................................................. 360/113
[58] Field of Search .................................... 360/113, 121; 324/252; 428/209

[56] References Cited

U.S. PATENT DOCUMENTS

| | | | |
|---|---|---|---|
| 4,949,039 | 8/1990 | Gruenberg | 360/113 |
| 5,287,238 | 2/1994 | Baumgart et al. | 360/113 |
| 5,541,868 | 7/1996 | Prinz | 365/98 |
| 5,641,557 | 6/1997 | Ishiwata | 360/113 |
| 5,718,978 | 2/1998 | Yamashita et al. | 428/425.9 |
| 5,728,454 | 3/1998 | Inaba et al. | 428/212 |
| 5,774,394 | 6/1998 | Chen et al. | 365/158 |
| 5,798,896 | 8/1998 | Araki et al. | 360/113 |

FOREIGN PATENT DOCUMENTS

| | | |
|---|---|---|
| 60-189906 | 9/1985 | Japan . |
| 61-264772 | 11/1986 | Japan . |
| 3-292705 | 12/1991 | Japan . |
| 5-347013 | 12/1993 | Japan . |
| 6-236527 | 8/1994 | Japan . |
| 7-38173 | 2/1995 | Japan . |
| 7-202292 | 8/1995 | Japan . |
| 7-297465 | 11/1995 | Japan . |
| 8-83937 | 3/1996 | Japan . |
| 8-87722 | 4/1996 | Japan . |
| 8-204253 | 8/1996 | Japan . |
| 8-279117 | 10/1996 | Japan . |

OTHER PUBLICATIONS

Magnetoresistance in [Cu{Fe–MnCuM}] Spin–Valve Multilayers ($M=Ni_{80}Fe_{15}Co_5$, $Ni_{80}Co_{20}$, $Co_{90}Fe_{10}$), H. Sakakima, et al., Japan Journal Appl. Phys, vol. 32, Part 2, No. 10A, (1993) pp. 1441–1443.

"Effects of Temperature on Exchange Coupled Alloys of $Ni_{80}Fe_{20}$–FeMn, $Ni_{80}Fe_{20}$–$\alpha Fe_2O_3$, and $Ni_{80}Fe_{20}$–TbCo", W. C. Cain, et al., J. Appl. Phys, vol. 61, No. 8, Apr. 15, 1987.

(List continued on next page.)

Primary Examiner—Allen T. Cao
Attorney, Agent, or Firm—Oblon, Spivak, McClelland, Maier & Neustadt, P.C.

[57] ABSTRACT

According to the present invention on a magnetoresistance device having a magnetoresistance effect element, since iron oxide $FeO_x$ exhibiting antiferromagnetism is used as a pinning layer, a spin-valve type magnetoresistance effect element can be obtained which is particularly excellent in corrosion resistance and has a magnetoresistance ratio with an MR slope no less than 0.7% Oe in the region of the high-frequency magnetic field of 1 MHz. Further, the rise-up characteristic of an MR curve at the zero magnetic field is extremely excellent with small hysteresis, and it has high heat resistance. The heat resistance is further improved by interposing an oxygen blocking layer between the pinning layer and a ferromagnetic layer. In the magnetoresistance device, for example, an MR head, using the magnetoresistance effect element having a magnetic multilayer film, an output voltage is approximately five times as high as that of the conventional material. Accordingly, there can be provided an excellent MR head which has extremely high reliability and enables the reading for ultrahigh density magnetic recording exceeding 1 $Gbit/inch^2$.

39 Claims, 16 Drawing Sheets

OTHER PUBLICATIONS

F. Tamamushi, et al., "Iwanami Rikagaku Jiten" $3^{RD}$ Ed., Feb. 24, 1981, Iwanami Shoten, p. 720, Commentary Column of "Hematite".

Physical Review B, vol. 43, No. 1, "Giant Magnetoresistance In Soft Ferromagnetic Multilayers", B.Dieny, et al., pp. 1297–1300.

Journal of Magnetism and Magnetic Materials 93 (1991) pp 101–104, "Spin–Valve Effect In Soft Ferromagnetic Sandwiches", B. Dieny, et al.

MAGNETORESISTANCE DEVICE

TECHNICAL FIELD

The present invention relates to a magnetoresistance device having a magnetoresistance effect element for reading the magnetic field intensity of a magnetic recording medium or the like as a signal and, in particular, to a magnetoresistance device, such as a magnetoresistance effect type head, having a magnetoresistance effect element which is capable of reading a small magnetic field change as a greater electrical resistance change signal.

BACKGROUND ART

Recently, there has been the development for increasing the sensitivity of magnetic sensors and increasing the density in magnetic recording and, following this, magnetoresistance effect type magnetic sensors (hereinafter referred to as MR sensors) and magnetoresistance effect type magnetic heads (hereinafter referred to as MR heads) using magnetoresistance change have been actively developed. Both MR sensors and MR heads are designed to read out external magnetic field signals on the basis of the variation in resistance of a reading sensor portion formed of magnetic material. The MR sensors have an advantage that a high sensitivity can be obtained and the MR heads have an advantage that a high output can be obtained upon reading out signals magnetically recorded in high density because the reproduced output does not depend on the relative speed of the sensors or heads to the recording medium.

However, conventional MR sensors which are formed of magnetic materials such as $Ni_{0.8}FeO_{0.2}$ (Permalloy), NiCo or the like have a small resistance change rate $\Delta R/R$ which is about 1 to 3% at maximum, and thus these materials have insufficient sensitivity as the reading MR head materials for ultrahigh density recording of the order of several Giga Bits Per Square Inches or more.

Attention has been recently paid to artificial lattices having the structure in which thin films of metal having a thickness of an atomic diameter order are periodically stacked, because their behavior is different from that of bulk metal. One of such artificial lattices is a magnetic multilayer film having ferromagnetic metal thin films and antiferromagnetic metal thin films alternately deposited on a substrate. Heretofore, magnetic multilayer films of iron-chromium and cobalt-copper types have been known. Among these materials, the iron-chromium (Fe/Cr) type was reported to exhibit a magnetoresistance change which exceeds 40% at an extremely low temperature (4.2 K). However, this artificial lattice magnetic multilayer film is not commercially applicable if it is left as it is because the external magnetic field at which a maximum resistance change occurs (operating magnetic field intensity), is as high as ten to several tens of kilo-oersted. Additionally, there have been proposed artificial lattice magnetic multilayer films of Co/Ag, which require too high operating magnetic field intensity.

Under these circumstances, a new structure which is called a spin valve has been proposed. In this structure, two NiFe layers are formed through a non-magnetic layer, and an FeMn layer is further formed so as to be adjacent to one of the NiFe layers. In this case, since the FeMn layer and the NiFe layer adjacent thereto are directly exchange-coupled to each other, the direction of the magnetic spin of this NiFe layer is fixed in the range of several tens to several hundreds Oe in magnetic field intensity. On the other hand, the direction of the magnetic spin of the other NiFe layer is freely varied by an external magnetic field. As a result, there can be achieved a magnetoresistance change rate (MR ratio) of 2 to 5% in a small magnetic field range which corresponds to the degree of coercive force of the NiFe layer. In addition, the following papers have been published.

a. Physical Review B, 43 (1991) 1297

Si/Ta(50)/NiFe(60)/Cu(20)/NiFe(45)/FeMn(70)/Ta(50) [parenthesis represents film thickness (unit: Å) of each layer, also applied hereinafter] is reported to exhibit that its MR ratio sharply rises up to 5.0% at an applied external magnetic field of 10 Oe.

b. Journal of Magnetism and Magnetic Materials, 93 (1991) 101

Si/Ta(50)/NiFe(60)/Cu(25)/NiFe(40)/FeMn(50)/Cu(50) is reported to exhibit that its MR ratio is 4.1% at an applied external magnetic field of 15 Oe.

c. Japanese Journal of Applied Physics, 32 (1993) L1441

The MR ratio is reported when the multilayer structure is adopted in the above paper a. In this multilayer structure, the structure of NiFe(60)/Cu(25)/NiFe(40)/FeMn(50) is laminated so as to sandwich Cu therebetween.

d. Journal of Applied Physics, 61 (1987) 4170

The magnitude and stability of one-way anisotropy are reported when a laminated structure, not the spin valve, is formed by FeMn, $\alpha$-$Fe_2O_3$, TbCo or the like, as an exchange-coupling film, and NiFe.

Furthermore, the following publications are made public.

e. Japanese Laid-Open Patent Publication No. Hei 2-61572 (U.S. Pat. No. 4,949,039)

It is described that a larger MR effect can be obtained by forming ferromagnetic thin films through a non-magnetic intermediate layer so as to be arranged in antiparallel to each other. In addition, it describes a structure in which antiferromagnetic material is disposed adjacently to one of the ferromagnetic layers.

f. Japanese Laid-Open Pat. Publication No. Hei 5-347013

A magnetic recording and reproducing device using a spin valve film is described. Particularly, it is disclosed that nickel oxide is used for an antiferromagnetic film.

In such a spin valve magnetic multilayer film, the MR ratio is lower than the structure of Fe/Cr, Co/Cu, Co/Ag or the like. However, the MR curve varies sharply at an applied magnetic field no greater than several tens Oe, so that it is suitably usable as MR head material for a recording density higher than 1 to 10 Gbit/inch$^2$. However, these papers and publications merely disclose the basic operation of the spin valve film. $Ni_{0.8}Fe_{0.2}$ (Permalloy) is mainly used as the MR head material for actual ultrahigh density magnetic recording at present. This material converts the change of a signal magnetic field from a magnetic recording medium into the change of electrical resistance by utilizing an anisotropic magnetoresistance effect. The MR ratio is in the range of 1 to 3% at most. In this case, the magnetoresistance change has a characteristic which is symmetrical relative to increase and decrease of the magnetic field with respect to the magnetic field of zero.

As a means for solving this characteristic, in case of NiFe, etc., a shunt layer of Ti or the like which has a low resistivity is provided to shift an operating point. Furthermore, in addition to the shunt layer, a soft film bias layer which is formed of soft magnetic material having a large resistivity such as CoZrMo, NiFeRh or the like is also provided to apply a bias magnetic field. However, the structure having such a bias layer complicates its manufacturing process, and makes it difficult to stabilize its characteristics, resulting in cost increase. Furthermore, in this case, a gently-sloping portion of an MR change curve which is caused by the shift of the MR curve is used, and thus the MR slope per unit magnetic field is reduced to a small value of about 0.05%/Oe, resulting in reduction of S/N. Therefore, this value is insufficient as the MR head material for the recording density higher than 1 to 10 Gbit/inch$^2$.

Furthermore, in case of MR heads, etc., there are some cases where a laminate structure is complicated, and thermal treatments such as baking, curing, etc. of resist materials are required in a patterning process, a flattening process, etc., so that heat resistance against a temperature of about 250 to 300 ° C. is required for MR materials. However, such a thermal treatment deteriorates the characteristics of the conventional artificial lattice structure.

With respect to the conventional spin valve film as disclosed in the papers, etc., only the basic structure and basic characteristics thereof as a thin film are argued, and any MR head structure to realize the ultrahigh density recording and any magnetic multilayer structure suitable therefor are not described.

Further, the spin valve film achieves the large MR effect by pinning two magnetic layers with the antiferromagnetic layer adjacent to one of them. Thus, the role of the antiferromagnetic layer is important and its reliability is extremely important. However, in case of FeMn mainly used at present, the Neel temperature is low, that is, 120 to 140 ° C., so that it is not sufficient in practice. Further, since FeMn is liable to corrosion, if rusted due to moisture in the atmosphere, its characteristic as antiferromagnetism tends to be lost so as not to show the spin valve operation.

Further, in the examples as described in these papers, when the thin films as described in these papers are applied as an MR head, the MR slope is small in an actual magnetic field detection range, and thus an excellent and stable reproduced output can not be obtained by the MR head. Furthermore, an MR change curve at an applied magnetic field of −10 to 10 Oe is important as a more excellent MR head material in the ultrahigh density magnetic recording. However, any of these papers has no argument on the details of the MR slope in this range.

Furthermore, a high-density recording and reproducing MR head is required to be used under high-frequency magnetic field no less than 1 MHz. However, in the film-thickness structure of each of the conventional three-element magnetic multilayers, it is difficult to set the slope (MR slope at a high frequency) of a magnetoresistance change curve at a width of 10 Oe in the high frequency magnetic field no less than 1 MHz, to no less than 0.7%/Oe, so as to obtain high sensitivity at high frequencies. The present invention has been made in view of the above situation, and its object is to provide an antiferromagnetic layer showing practically sufficient reliability, and provide a magnetoresistance effect element with a magnetic multilayer film having a high heat-resistance, which has a high MR ratio, a linear MR change rise-up characteristic in an extremely small magnetic field range of about −10 to 10 Oe, a high sensitivity to magnetic field and a large MR slope under a high-frequency magnetic field, and further provide a magnetoresistance device, such as a magnetoresistance effect type head, having the magnetoresistance effect element.

DISCLOSURE OF INVENTION

For solving the foregoing problems, the present invention is a magnetoresistance device comprising a magnetoresistance effect element, conductive films and electrode portions, wherein the conductive films are conductively connected to the magnetoresistance effect element through the electrode portions, and the magnetoresistance effect element comprises a magnetic multilayer film including a non-magnetic metal layer, a ferromagnetic layer formed on one surface of the non-magnetic metal layer, a soft magnetic layer formed on the other surface of the non-magnetic metal layer, and a pinning layer which is formed on (a surface opposite to a surface abutting the non-magnetic metal layer) the ferromagnetic layer to pin a direction of magnetization of the ferromagnetic layer, and wherein the pinning layer is formed of FeO$_x$ (1.35≦x ≦1.55, unit: atomic ratio).

In a preferred mode of the present invention, it is arranged that the magnetoresistance effect element comprises a substrate from which the pinning layer, the ferromagnetic layer, the non-magnetic metal layer and the soft magnetic layer are laminated successively.

In a preferred mode of the present invention, it is arranged that a thickness of the pinning layer is set to 100 Å to 3,000 Å.

In a preferred mode of the present invention, it is arranged that the pinning layer is formed of α-Fe$_2$O$_3$ (hematite) exhibiting antiferromagnetism.

In a preferred mode of the present invention, it is arranged that the pinning layer contains α-Fe$_2$O$_3$ (hematite) exhibiting antiferromagnetism at least no less than 30 volume % and no more than 60 volume %.

In a preferred mode of the present invention, it is arranged that the pinning layer is formed of an aggregate of microcrystals, no greater than 100 Å, of α-Fe$_2$O$_3$ (hematite) exhibiting antiferromagnetism.

In a preferred mode of the present invention, it is arranged that the pinning layer exhibits antiferromagnetism and its Neel temperature is 120 ° C. to 400 ° C.

In a preferred mode of the present invention, it is arranged that the pinning layer is a film formed by sputtering a target of iron oxide by an ion beam sputtering method while applying an assist beam of mixed gas of Ar and O$_2$ relative to the substrate.

In a preferred mode of the present invention, it is arranged that the assist beam is within ranges of an accelerating voltage 60 to 150 eV, an ion current 4 to 15 mA, Ar:O$_2$ flow ratio 1:1 to 9:1 and an Ar+O$_2$ flow rate 6 to 20 sccm.

In a preferred mode of the present invention, it is arranged that the pinning layer is a film formed by sputtering a target of iron oxide in an atmosphere of mixed gas of Ar and oxygen using a high-frequency sputtering method while adjusting an oxygen gas flow rate upon film formation to 20 to 40% relative to a total gas flow rate.

In a preferred mode of the present invention, it is arranged that the ferromagnetic layer has a composition represented by (Co$_z$Ni$_{1-z}$)$_w$Fe$_{1-w}$ (0.4≦z≦1.0, 0.5≦w≦1.0 by weight), and the soft magnetic layer has a composition represented by (Ni$_x$Fe$_{1-x}$)$_y$Co$_{1-y}$ (0.7≦x≦0.9, 0.1≦y≦0.5 by weight).

In a preferred mode of the present invention, it is arranged that the ferromagnetic layer has a composition represented by (Co$_z$Ni$_{1-z}$)$_w$Fe$_{1-w}$ (0.4≦z≦1.0, 0.5≦w≦1.0 by weight), and the soft magnetic layer has a composition represented by Co$_t$M$_u$M'$_q$B$_r$ (0.6≦t≦0.95, 0.01≦u≦50.2, 0.01≦q≦0.1, 0.05≦r≦0.3 by atomic ratio; M represents at least one material selected from Fe and Ni, and M' represents at least one material selected from Zr, Si, Mo and Nb).

In a preferred mode of the present invention, it is arranged that the non-magnetic metal layer is formed of a material containing at least one material selected from Au, Ag and Cu.

In a preferred mode of the present invention, it is arranged that the magnetoresistance effect element shows a spin-valve type magnetoresistance change due to magnetization of the ferromagnetic layer pinned by the pinning layer.

In a preferred mode of the present invention, it is arranged that the magnetoresistance effect element has a slope of magnetoresistance change which is 0.7%/Oe or more at a width of 6 Oe under high-frequency magnetic field of 1 MHz.

In a preferred mode of the present invention, it is arranged that the magnetoresistance device is a magnetoresistance effect type head.

In a preferred mode of the present invention, it is arranged that both end portions of the magnetoresistance effect element are coupled to the electrode portions so that the whole end portions thereof are contacted with the electrode portions.

In a preferred mode of the present invention, it is arranged that linking soft magnetic layers are further provided between the magnetoresistance effect element and the electrode portions which are formed at both end portions of the magnetoresistance effect element, wherein the linking soft magnetic layers and the whole end portions of the magnetoresistance effect element are in abutment with each other.

In a preferred mode of the present invention, it is arranged that the linking soft magnetic layer is continuously formed between the magnetoresistance effect element and each of the electrode portions formed at both end portions of the magnetoresistance effect element and in contact with a lower surface of the electrode portion.

In a preferred mode of the present invention, it is arranged that the magnetoresistance device has no biasing magnetic field applying mechanism.

In a preferred mode of the present invention, it is arranged that the ferromagnetic layer is formed while applying an external magnetic field of 10 to 300 Oe in the same direction as a signal magnetic field and in a film in-plane direction upon film formation, and the soft magnetic layer is formed while applying an external magnetic field of 10 to 300 Oe in a direction perpendicular to the direction of the signal magnetic field and in a film in-plane direction upon film formation.

In a preferred mode of the present invention, it is arranged that the laminated magnetoresistance effect element is applied with a heat treatment at a temperature of 100° C. to 300° C.

In a preferred mode of the present invention, it is arranged that the magnetoresistance effect element is applied with a heat treatment at a temperature of 100° C. to 300° C. after the pinning layer is formed.

The present invention is a magnetoresistance device comprising a magnetoresistance effect element, conductive films and electrode portions, wherein the conductive films are conductively connected to the magnetoresistance effect element through the electrode portions, wherein the magnetoresistance effect element has a substrate on which a pinning layer for pinning a direction of magnetization of a ferromagnetic layer, the ferromagnetic layer, a non-magnetic metal layer and a soft magnetic layer are laminated successively, and wherein the pinning layer is formed of $FeO_x$ ($1.35 \leq x \leq 1.55$, unit: atomic ratio) and an oxygen blocking layer formed of Co or an alloy containing Co no less than 80 weight % and having a thickness of 4 to 30 Å is interposed between the pinning layer and the ferromagnetic layer.

According to the invention as to the foregoing magnetoresistance effect element, the antiferromagnetic layer particularly excellent in corrosion resistance, and the magnetic multilayer film employing it and having the magnetoresistance ratio with the MR slope no less than 0.8%/Oe, can be obtained. In addition, the rise-up characteristic of the MR curve at the zero magnetic field is quite excellent. Further, the high heat-resistance magnetic multilayer film can be obtained, whose MR slope at the high frequency of 1 MHz reveals the high value no less than 0.7%/Oe and further whose characteristic is not deteriorated even if the heat treatment around 250° C. is applied to. According to the invention on the magnetoresistance device (for example, the MR head or the like) having such a magnetoresistance effect element, the output voltage is approximately five times as high as that of the conventional material. Accordingly, the quite excellent effect is achieved that the highly reliable reading of ultrahigh density magnetic recording exceeding 1 $Gbit/inch^2$ is made possible.

BEST MODE FOR CARRYING OUT THE INVENTION

Hereinbelow, the concrete structures of the present invention will be described in detail.

Figure 1:
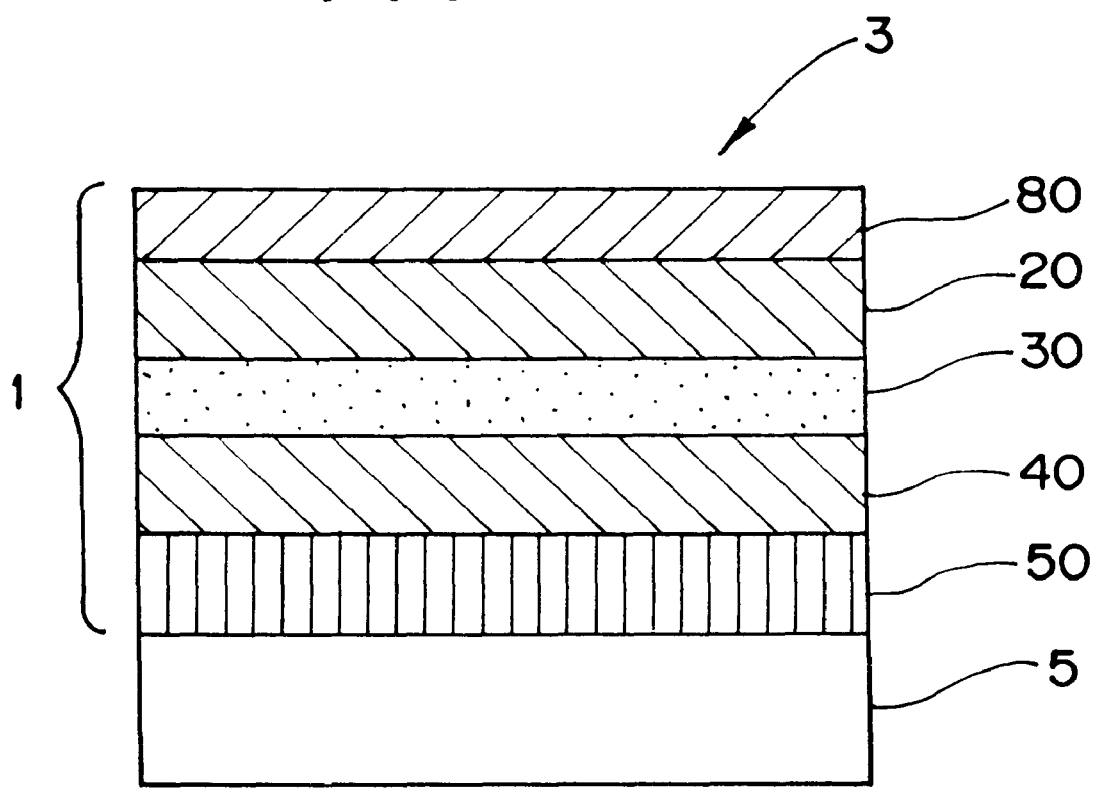
FIG. 1 is a sectional view showing a magnetoresistance effect element according to the present invention.

FIG. 1 is a sectional view showing a magnetoresistance effect element 3 according to an embodiment of the present invention. The magnetoresistance effect element 3 has an artificial lattice magnetic multilayer film 1 (hereinafter merely referred to as magnetic multilayer film 1). In FIG. 1, the magnetic multilayer film 1 has a laminate body structure which includes a non-magnetic metal layer 30, a ferromagnetic layer 40 formed on one surface of the non-magnetic metal layer 30, a soft magnetic layer 20 formed on the other surface of the non-magnetic metal layer 30, and a pinning layer 50 which is formed on the ferromagnetic layer 40 to pin the direction of magnetization of the ferromagnetic layer 40 (In the drawing, although the pinning layer is located below the ferromagnetic layer, "on" represents a surface opposite to a surface abutting the non-magnetic metal layer).

As shown in FIG. 1, the laminate body is normally formed on a substrate 5, and they are laminated from the side of the substrate in the order of the pinning layer 50, the ferromagnetic layer 40, the non-magnetic metal layer 30 and the soft magnetic layer 20. Further, as shown in the drawing, a protective layer 80 is formed on the soft magnetic layer 20.

In this invention, it is required that the soft magnetic layer 20 and the ferromagnetic layer 40 which are formed at both sides of the non-magnetic metal layer 30 so as to be adjacent to the non-magnetic metal layer 30, have substantially different magnetization directions from each other in accordance with a signal magnetic field applied from the external. The reason is as follows: In the principle of the present invention, when the magnetization directions of the soft magnetic layer 20 and the ferromagnetic layer 40 which are formed through the non-magnetic metal layer 30 are deviated from each other, conduction electrons have a behavior of scattering due to spins to increase its resistance. In this case, when the magnetization directions are opposite to each other, the maximum resistance is obtained. That is, in this invention, when a signal magnetic field from the external is positive (in an upward direction with respect to the recording surface 93 of a recording medium 90 (represented by reference numeral 92)) as shown in FIG. 2, there occur components in the neighboring magnetic layers whose magnetization directions are opposite to each other, so that the resistance is increased.

Here, the relationship among the external signal magnetic field from a magnetic recording medium, magnetization directions of the soft magnetic layer 20 and the ferromagnetic layer 40 and the variation of electrical resistance will be described.

Now, in order to facilitate the understanding of the present invention, a simplest magnetic multilayer film in which a pair of a soft magnetic layer 20 and a ferromagnetic layer 40 exist through a non-magnetic metal layer 30 as shown in FIG. 1 will be described with reference to FIG. 2.

Figure 2:
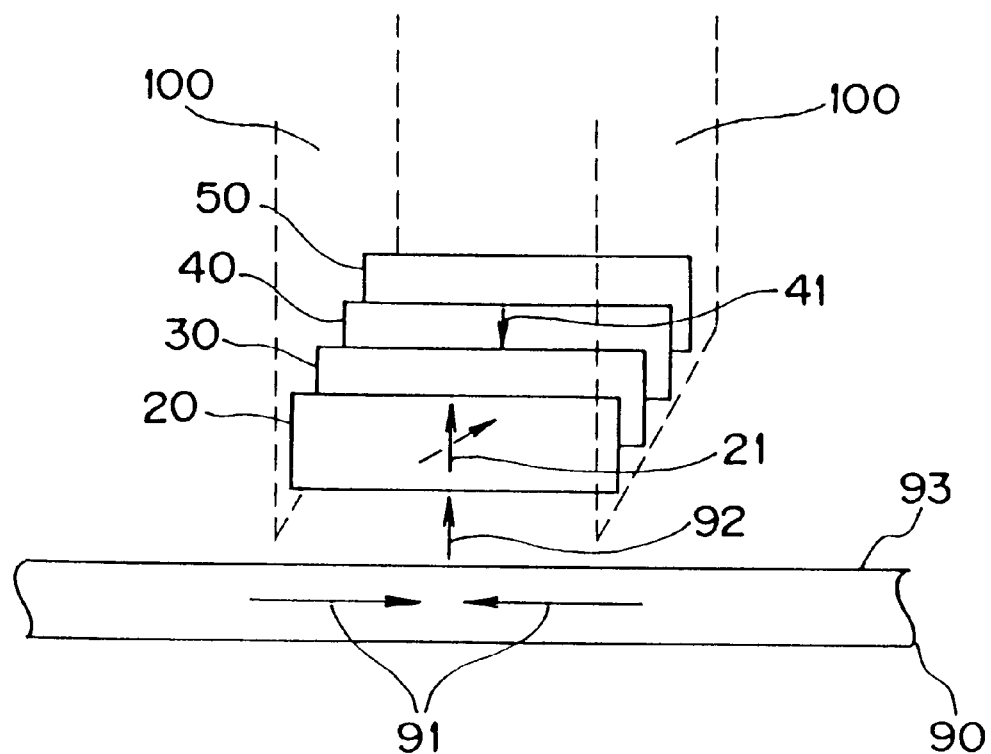
FIG. 2 is a schematic diagram showing a magnetoresistance effect element, particularly, a structure of a magnetic multilayer film, for explaining an operation of the present invention.

As shown in FIG. 2, the magnetization of the ferromagnetic layer 40 is pinned in a downward direction to the surface of the recording medium by a method as described later (reference numeral 41). The soft magnetic layer 20 is formed through the non-magnetic metal layer 30, so that the magnetization direction thereof is varied in accordance with the signal magnetic field from the external (reference numeral 21). At this time, the relative angle between the magnetization directions of the soft magnetic layer 20 and the ferromagnetic layer 40 is greatly varied in accordance with the direction of the signal magnetic field from the magnetic recording medium 90. As a result, the scattering degree of the conduction electrons flowing in the magnetic layers is varied, and thus the electrical resistance is greatly varied.

Accordingly, a large MR (Magneto-Resistive) effect, which is substantially different in mechanism from the anisotropic magnetoresistance effect of ordinary permalloy, can be obtained.

Figure 3A:
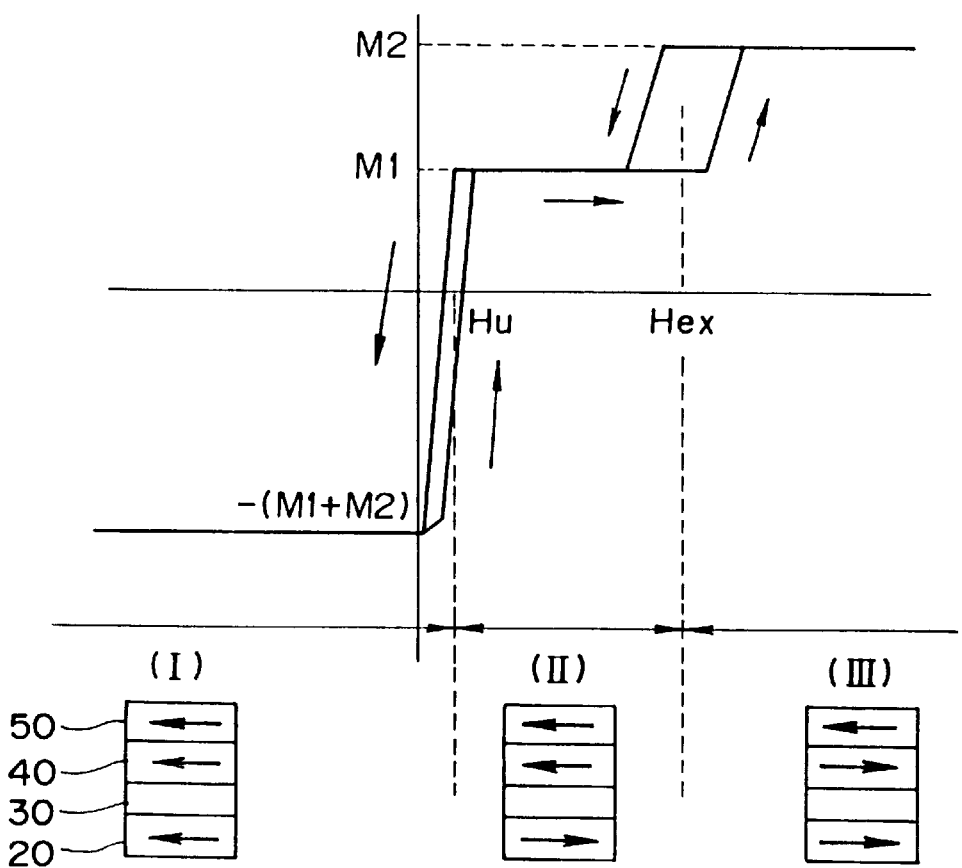
FIG. 3 is a schematic diagram showing a magnetization curve and an MR curve for explaining an operation of the present invention.
Figure 3B:
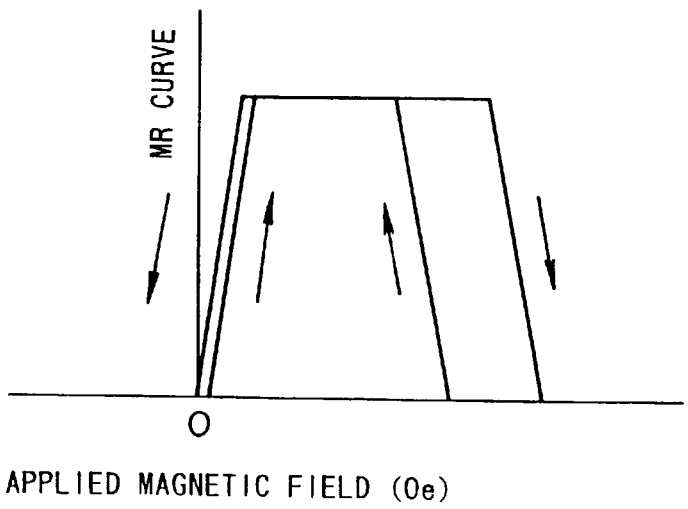

The magnetization directions of the soft magnetic layer 20, the ferromagnetic layer 40 and the pinning layer 50 exhibiting a pinning effect are varied relative to the external magnetic field. The variation of the magnetization directions thereof is shown in FIG. 3 in correspondence with the magnetization curve and the MR curve. In this case, all the magnetization of the ferromagnetic layer 40 is fixed in a minus direction (in a downward direction with respect to the recording surface of the recording medium 90). When the external signal magnetic field is minus, the magnetization of the soft magnetic layer 20 is in the minus direction. Now, it is assumed that the coercive force of each of the soft magnetic layer 20 and the ferromagnetic layer 40 is approximate to zero in order to simplify the description. In an area (I) where the signal magnetic field H<0, the magnetization of both the soft magnetic layer 20 and the ferromagnetic layer 40 is in a fixed one same direction.

When the external magnetic field is intensified and H exceeds the coercive force of the soft magnetic layer 20, the magnetization direction of the soft magnetic layer is rotated in the direction of the signal magnetic field, so that the magnetization and the electrical resistance are increased as the magnetization directions of the soft magnetic layer 20 and the ferromagnetic layer 40 become antipbrallel to each other. Finally, these values are fixed (state of an area (II)). At this time, a pinning magnetic field Hex is applied by the pinning layer 50. If the signal magnetic field exceeds Hex, the magnetization of the ferromagnetic layer 40 is also rotated in the direction of the signal magnetic field, so that the magnetization of each of the soft magnetic layer 20 and the ferromagnetic layer 40 is oriented in the same fixed direction in an area (III). At this time, the magnetization is set to a constant value, and the MR curve is equal to zero.

Conversely, when the signal magnetic field H is reduced, the magnetization is changed from the area (III) through the area (II) to the area (I) by inversion of the magnetization of the soft magnetic layer 20 and the ferromagnetic layer 40 in the same manner as described above. At an initial portion of the area (II), conduction electrons have a behavior of scattering dependent on spins, and the resistance is increased. In the area (II), the ferromagnetic layer 40 has little magnetization inversion because it is pinned, while the magnetization of the soft magnetic layer 20 increases linearly, so that the rate of spin-dependent scattered conduction electrons is gradually increased in accordance with the magnetization change of the soft magnetic layer 20. That is, if $Ni_{0.8}Fe_{0.2}$ whose Hc is low is selected for the soft magnetic layer 20 and a suitable anisotropic magnetic field Hk is applied, a formed magnetic multilayer film has a linearly-varying resistance and a large magnetoresistance ratio in a small external magnetic field of several Oe to several tens Oe below Hk.

In the present invention, the thickness of each of the thin film layers has an individual limit value. It is preferable that a thickness of the non-magnetic metal layer is in the range from 15 to 40 Å. If the thickness of the non-magnetic metal layer is greater than 40 Å, the rate of the conduction electrons flowing through only this layer increases, so that the total MR change becomes small unfavorably. If the thickness becomes thinner than 15 Å, the ferromagnetic magnetic-coupling between the soft magnetic layer 20 and the ferromagnetic layer 40 is so increased that the antiparallel state of the spins for achieving the large MR effect can not be obtained. On the other hand, the conduction electrons are scattered at the interface portion between the non-magnetic metal layer and each of the soft magnetic layer 20 and the ferromagnetic layer 40, so that the effect is not substantially improved even if the thickness of the two magnetic layers 20, 40 is larger than 200 Å. Rather, it is unfavorable because the total film thickness is increased. The lower limit of the thickness of the two magnetic layers 20 and 40 is preferably set to 16 Å or more. If the thickness is smaller than this value, heat resistance and resistance against processing are deteriorated.

Hereinbelow, each constitution of the foregoing magnetoresistance effect element 3 will be described in detail. The first feature of this magnetoresistance effect element resides in composition of the pinning layer.

The pinning layer 50 of the magnetoresistance effect element in the present invention is characterized in that it is used for pinning the magnetization of the ferromagnetic layer 40 substantially adjacent thereto, and is preferably formed of, particularly, $FeO_x$ ($1.35 \leq x \leq 1.55$, unit: atomic ratio).

In general, an a phase of a chemical composition formula $Fe_2O_3$ is known as hematite. This substance exhibits antiferromagnetism and its Neel temperature is 677° C. which is much higher than room temperature. The high Neel temperature represents that the thermostability of the pinning effect is high so that it is advantageous when applying the magnetoresistance effect element to the MR head or the like. However, the structure of hematite is called a corundum structure where the configuration of Fe ions and O ions is complicated. It is difficult to form a magnetic thin film of hematite showing antiferromagnetism due to its complicated structure, while such formation is easy in case of monocrystal bulk or the like. Although there has been an example of formation with a thickness of the magnetic thin film no less than 5,000 Å, it is quite difficult in case of a thin film of 100 to 3,000 Å in thickness, which is within the technical scope of the present invention. This is because, when forming an oxide film of Fe using a thin film forming method in the vacuum, O is dissociated so that $Fe_3O_4$ (magnetite) is formed.

In view of this, the inventors have made researches assiduously and, as the result, it has been found out that, if the hematite phase itself is realized, the Neel temperature is so high that inconvenience occurs in the course of fabricating the normal MR head. As a result of fully studying the iron oxide thin film and the degree of oxidation, it has been found out that, by adjusting the oxidation degree to the range of $1.35 \leq x \leq 1.55$ (unit: atomic ratio), preferably $1.40 \leq x \leq 1.55$, in $FeO_x$, the characteristic necessary for the MR head can be achieved. If a value of the foregoing x becomes greater than 1.55, oxygen is in excess so that oxygen atoms are captured between the iron oxide lattices in the thin film to deteriorate the characteristic. On the other hand, if a value of x becomes smaller than 1.35, the characteristic approaches that of magnetite and loses antiferromagnetism so as not to show the spin-valve type characteristic.

The thickness of the pinning layer 50 is set to 80 to 3,000 Å, preferably 80 to 1.000 Å, more preferably 80 to 800 Å, still more preferablIy 80 to 400 Å. If iron oxide forming the pinning layer becomes less than 80 Å in thickness, it does not show antiferromagnetism. On the other hand, in case of being thicker, it is not so serious. However, if it is too thick, a gap length (a shield—shield length) of the MR head is so increased that it is not suitable for the ultrahigh density magnetic recording. Thus, it is preferably less than 3,000 Å.

The $FeO_x$ composition as the pinning layer 50 may be $\alpha$-$Fe_2O_3$ (hematite) exhibiting antiferromagnetism, wherein x=1.5 (unit: atomic ratio). In this case, depending on selection of materials of the ferromagnetic layer 40 to be pinned, the non-magnetic metal layer 30 and the soft magnetic layer 20 and designing of layer thicknesses, the foregoing Neel temperature can be set low so as to enable manufacturing the MR head.

Further, the pinning layer 50 made of iron oxide may contain $\alpha$-$Fe_2O_3$(hematite) exhibiting antiferromagnetism at least no less than 30 volume % and no more than 60 volume %. Since hematite itself has the very high Neel temperature, if this phase is contained in the pinning layer no less than 30 volume % and no more than 60 volume %, the pinning effect is practically sufficient for the MR head. On the other hand, if it is less than 30 volume %, antiferromagnetism is not sufficient as the pinning layer so as not to show the spin-valve type GMR (giant magnetoresistance). On the other hand, if the hematite phase exceeds 60 volume %, it is possible that the Neel temperature becomes too high so that later-described switching of the pinning direction of the spin of the ferromagnetic layer for achieving the spin-valve operation becomes difficult in practice, and thus it is unfavorable. The remaining part may be a magnetite phase or a wustite phase. On the other hand, it may be an alloy or compound with other materials.

Since hematite itself has the very high Neel temperature, even if the pinning layer 50 is an aggregate of microcrystals, no greater than 100 Å, particularly in the range from 60 to 100 Å, of $\alpha$-$Fe_2O_3$ (hematite) exhibiting antiferromagnetism, the pinning effect is practically sufficient for the MR head. The size of microcrystals may be measured based on observation of an image by a TEM.

It is not necessary that the pinning layer 50 is clearly identified as hematite, but is sufficient that it has a crystal lattice approximate to hematite and exhibits antiferromagnetism with its Neel temperature being in the range from 120° C. to 400° C., preferably from 150° C. to 300° C. and more preferably from 150° C. to 250° C.

The pinning layer 50 is formed using a method, such as an ion beam sputtering method, a sputtering method, a reactive deposition method or a molecular beam epitaxy (MBE) method. There is no particular limitation to these film forming methods. In the film forming method based on a dual ion beam sputtering method, the oxygen amount in the iron oxide thin film can be precisely controlled. Specifically, a target of iron oxide is sputtered by the ion beam sputtering method so as to form a pinning layer by applying an assist beam of mixed gas of Ar (argon) and $O_2$ (oxygen) relative to a substrate to be coated, so that the pinning layer having an excellent characteristic can be formed. In case of the normal ion beam sputtering method, since the kinetic energy of a sputtering beam entering the target is large, oxygen is dissociated so that only a thin film of magnetite is formed. Thus, the film is formed by applying the mixed gas of Ar and $O_2$ as the assist beam.

At this time, the assist beam applied to the substrate to be coated may be within the ranges of an accelerating voltage 60 to 150 eV, an ion current 5 to 15 mA, $Ar:O_2$ flow ratio 1:1 to 9:1 and an $Ar+O_2$ flow rate 6 to 20 sccm. If the accelerating voltage of the assist beam exceeds 150 eV, the energy is too large, so that oxygen is implanted to disarrange the crystal lattice and thus the sufficient antiferromagnetic characteristic can not be obtained. On the other hand, if the accelerating voltage becomes less than 60 eV, oxygen is not configured well in the crystal lattice so that the Neel temperature is lowered, which is unfavorable. The range from 80 to 120 eV is preferable. If the ion current exceeds 15 mA, the number of oxygen ions entering the substrate is too large, so that oxygen is implanted to disarrange the crystal lattice and thus the sufficient antiferromagnetic characteristic can not be obtained. On the other hand, if the ion current becomes less than 5 mA, oxygen is not configured well in the crystal lattice so that the Neel temperature is lowered, which is unfavorable. The range from 6 to 12 mA is preferable. It is preferable that the flow ratio of Ar and $O_2$ in the assist beam is $Ar:O_2$=1:1 to 4:1. If the ratio of $Ar:O_2$ exceeds 9:1 so that Ar is in excess, the adding effect of O ions to the iron oxide thin film can not be sufficient. To the contrary, if the ratio becomes less than 1:1 so that $O_2$ is in excess, a filament for generating the assist beam tends to be cut so that the manufacturing is disabled. The total flow rate of $Ar+O_2$ in the assist beam may be within the range from 6 to 20 sccm. If the total flow rate exceeds 20 sccm, the number of oxygen ions is too large, so that oxygen is implanted to disarrange the crystal lattice and thus the sufficient antiferromagnetic characteristic can not be obtained. To the contrary, if less than 6 sccm, oxygen is not configured well in the crystal lattice so that the Neel temperature is lowered, which is unfavorable.

It is also preferable to form the pinning layer 50 using a radio-frequency sputtering method (RF sputtering method), like the foregoing ion beam sputtering method with the assist beam. In the radio-frequency sputtering method, a target of iron oxide is sputtered under mixed gas of Ar (argon) and $O_2$ (oxygen). In this case, it is necessary to adjust the oxygen gas flow rate so as to be within the flow ratio range from 20 to 40% relative to the total gas flow rate. If this ratio becomes less than 20%, a coupling force of oxygen in the formed pinning layer 50 is so small that the state of oxygen is unstable to lower the heat-proof temperature, which is unfavorable. On the other hand, if the ratio exceeds 40%, the plasma upon sputtering can not be generated stably. Further, even if the plasma is generated, since oxygen contents are large in the sputtering atmosphere, the substantial sputtering rate is lowered extremely. This increases impurities trapped into the formed film so that the excellent film can not be achieved. On the other hand, if the hematite oxide film is formed using the radio-frequency sputtering method under Ar (argon) gas which has been performed conventionally, the hematite oxide film is exposed to the plasma to dissociate oxygen in the film so that the excellent hematite oxide, which the present invention aims to achieve, can not be obtained. Further, there is also a problem about the thermostability of the obtained film itself.

The ferromagnetic layer 40 is formed of a metal element such as Fe, Ni, Co, Mn, Cr, Dy, Er, Nd, Tb, Tm, Ce, Gd, alloy or compound containing the above metal element. Particularly, it is preferably formed of a composition expressed by $(Co_zNi_{1-z})_wFe_{1-w}$ ($0.4 \leq z \leq 1.0$, $0.5 \leq w \leq 1.0$ by weight). Out of the composition range as described above, no large electrical resistance change can be obtained.

The thickness of the ferromagnetic layer 40 as described above is set to 16 to 100Å, and more preferably 20 to 60Å. If this value is smaller than 16Å, it loses the characteristic as the ferromagnetic layer. On the other hand, if the value exceeds 100 Å, the pinning force of the pinning layer 50 Å is reduced, and thus the sufficient pinning effect of the spin of the ferromagnetic layer can not be obtained.

As described above, since the ferromagnetic layer 40 is in direct abutment with the pinning layer 50, a direct interlayer interaction acts on each other, and the rotation of the magnetization of the ferromagnetic layer 40 is prevented. On the other hand, with respect to the soft magnetic layer 20 as described later in detail, its magnetization can be freely rotated by a signal magnetic field from outside. As a result, a relative angle between both the soft magnetic layer 20 and the ferromagnetic layer 40 is produced, so that a large MR effect due to the difference between the magnetization directions can be obtained.

Figure 18:
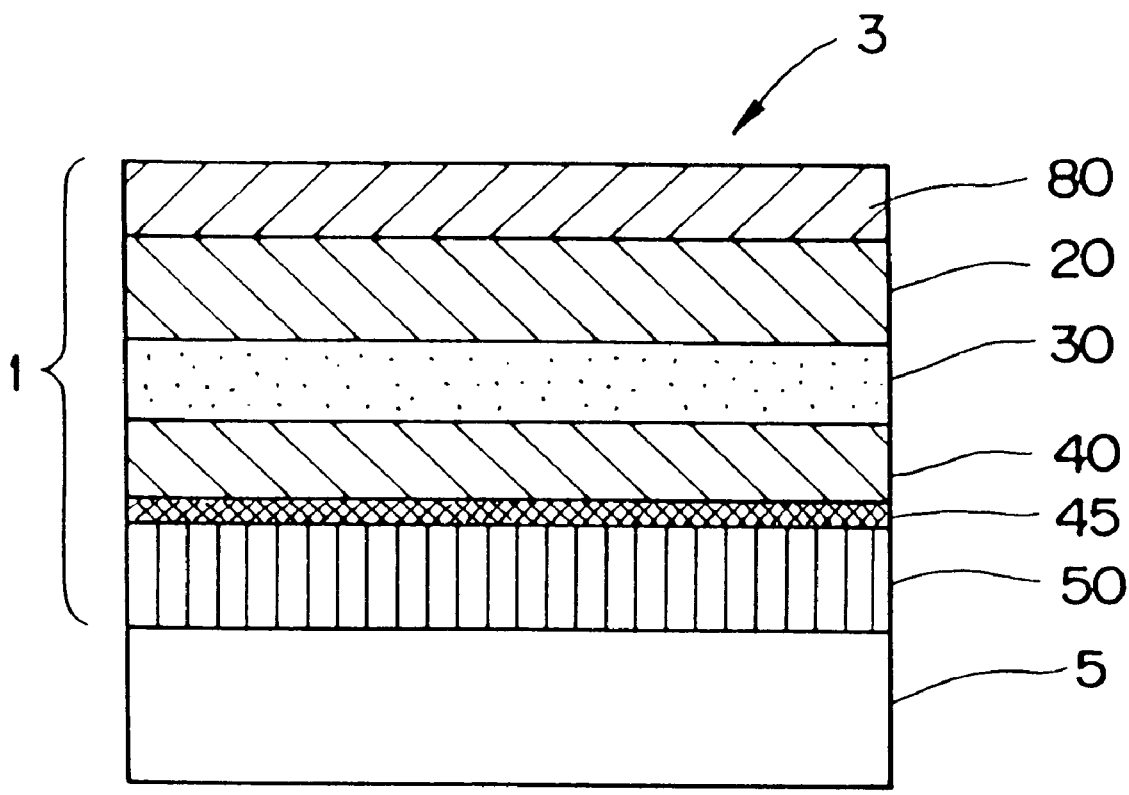
FIG. 18 is a sectional view showing a magnetoresistance effect element according to another embodiment of the present invention.

In the present invention, as shown in FIG. 18, it is preferable to interpose an oxygen blocking layer 45 between the pinning layer 50 and the ferromagnetic layer 40. The oxygen blocking layer 45 is formed of a simple substance of Co (cobalt) or an alloy containing Co no less than 80 weight %. A thickness thereof is set to 4 to 35 Å, and more preferably, 6 to 30 Å. If the Co component becomes less than 80 weight %, the blocking effect against oxygen diffused from the pinning layer 50 becomes insufficient in the process of heat treatment after formation of the laminate body so that the pinning effect is lost due to the heat treatment so as not to exhibit the spin-valve characteristic. The oxygen blocking effect by the oxygen blocking layer 45 is maximum when the oxygen blocking layer 45 is formed of the single substance of Co (cobalt). In case of the alloy containing the Co component no less than 80 weight %, the effect can be maintained at the practically sufficient level.

The necessity for the oxygen blocking layer 45 is caused by the fact that the oxide antiferromagnetic body like $FeO_x$ ($1.35 \leq x \leq 1.55$, unit: atomic ratio) is used as the pinning layer 50 of the present invention. Specifically, in the present invention, since the pinning layer 50 is formed of the oxide antiferromagnetic body, if, for example, general NiFe (Permalloy) or the like is used as a material of the ferromagnetic body abutting the pinning layer 50, it has been found out that a problem is raised about the thermostability and the heat resistance. That is, in the process of heat treatment, oxygen in the antiferromagnetic body is diffused into the ferromagnetic body to lose the pinning effect of the spin.

If the thickness of the oxygen blocking layer 45 becomes less than 4 Å, cobalt (Co) does not form a continuous film so that the oxygen blocking effect is not generated. On the other hand, if the thickness exceeds 35 Å, a coercive force Hc tends to be increased, which is not so preferable.

The oxygen blocking layer 45 reveals ferromagnetism and partly overlaps the preferable composition range of the ferromagnetic layer 40. Accordingly, the oxygen blocking layer 45 has a function similar to that of the ferromagnetic layer 40. Therefore, when providing the oxygen blocking layer 45, the total thickness ($t_b + t_f$) of a thickness $t_b$ of the oxygen blocking layer 45 and a thickness $t_f$ of the ferromagnetic layer 40 may be set to the foregoing range of the ferromagnetic layer 40, that is, 16 to 100 Å, and more preferably, 20 to 60 Å. On the other hand, it may be arranged that the oxygen blocking layer 45 and the ferromagnetic layer 40 have the same composition, that is, the single substance of Co (cobalt) or the alloy containing Co no less than 80 weight %, so as to be formed by one layer. Further, it may be arranged that they are formed by one layer having a Co-rich side abutting the pinning layer 50 while gradually reducing Co content rates as going away from the pinning layer 50, so as to have the functions of both the oxygen blocking layer 45 and the ferromagnetic layer 40.

The soft magnetic layer 20 is formed of Fe, Ni, Co or the like, or alloy or compound containing these elements. The MR curve rises up more sharply by using the magnetic layer having a small coercive force Hc, and a favorable effect can be obtained. Particularly, a composition as expressed by $(Ni_xFe_{1-x})_yCo_{1-y}$ ($0.7 \leq x \leq 0.9$, $0.1 \leq y \leq 0.5$ by weight) is preferable. Here, if x, y are within these ranges, Hc becomes small and excellent soft magnetic characteristics can be obtained, so that an excellent MR characteristic having high magnetic field sensitivity can be obtained. On the other hand, if x, y are out of these ranges, Hc becomes large, so that no MR characteristic having high magnetic field sensitivity can be obtained unfavorably. Such a composition system is a composition system where the Co concentration is large. In the spin valve film, the soft magnetic layer causes the large MR ratio by changing its direction sensitively relative to a small external magnetic field. Accordingly, the soft magnetic characteristic is important. Permalloy is known as a typical soft magnetic material. However, since Ni forming permalloy is easily solubilized with the non-magnetic metal layer 30, there is a problem in heat resistance. Thus, for solving this, it is preferable to select the composition having the large Co concentration as represented by $(Ni_xFe_{1-x})_yCo_{1-y}$ ($0.7 \leq x \leq 0.9$, $0.1 \leq y \leq 0.5$ by weight).

Furthermore, as a composition of the soft magnetic layer 20, the composition as expressed by $CO_tM_uM'_qB_r$ ($0.6 \leq t \leq 0.95$, $0.01 \leq u \leq 0.2$, $0.01 \leq q \leq 0.1$, $0.05 \leq r \leq 0.3$ by atomic ratio) also exhibits an excellent characteristic. Here, M includes at least one kind selected from Fe and Ni, and M' includes at least one kind selected from Zr, Si, Mo and Nb. When M and M' includes at least two kinds of materials, the total amount of at least the two kinds are set to be within the above composition range. Such a composition contains a large amount of Co, so that it has an extremely excellent advantage that the MR ratio is larger than the composition as described above. Further, the heat resistance is increased. Furthermore, it has a crystal structure in which ultrafine crystal particles are assembled or an amorphous structure, and thus it exhibits an excellent soft magnetic characteristic, so that the large MR slope can be obtained. As a specific composition, Co is contained as a main component and the amount of Ni and/or Fe is set so that magnetostriction is equal to zero. Further, Zr, Si, Mo, Nb or the like is added to this composition to stabilize the amorphous composition. If the composition ratio of Co is lower than 0.6, no amorphous state can be obtained. The composition ratio of Co may exceed 0.95, and a small amount of Fe or Ni is preferably added because an excellent characteristic as the soft magnetic material can be obtained. The composition ratio of M' is set to $0.01 \leq q \leq 0.1$, and no effect of the addition of M' can be obtained if q is lower than 0.01. If q exceeds 0.1, the characteristic as the soft magnetic material is deteriorated. B (boron) is the main element to make amorphous, and its composition ratio is set to $0.05 \leq r \leq 0.3$. If r is lower than 0.05, no effect of the addition of B can be obtained. If r exceeds 0.3, the characteristic as the soft magnetic material is deteriorated.

On the other hand, the soft magnetic layer 20 may have a laminate structure. In this case, it is preferable that the soft magnetic layer 20 is a laminate body including, from the side of the non-magnetic layer, a first soft magnetic layer formed of Co or an alloy containing Co no less than 80 weight %, and a second soft magnetic layer having a composition represented by $(Ni_xFe_{1-x})_yCo_{1-y}$ ($0.7 \leq x \leq 0.9$, $0.1 \leq y \leq 0.5$ by weight).

The thickness of the soft magnetic layer 20 as described above is set to 20 to 150 Å, preferably 30 to 120 Å, and more preferably 50 to 100 Å. If this value is smaller than 20 Å, no excellent characteristic as the soft magnetic layer can be obtained. On the other hand, if the value exceeds 150 Å, the total thickness of the multilayer film is large and the resistance of the whole magnetic multilayer film is increased, so that the MR effect is reduced.

In order to conduct electrons efficiently, a metal having conductivity is preferably used for the non-magnetic metal layer which is interposed between the soft magnetic layer 20 and the ferromagnetic layer 40. More specifically, it may be formed of at least one kind selected from Au, Ag and Cu, alloy containing 60 weight % or more of at least one of these elements, or the like.

The thickness of the non-magnetic metal layer 30 is preferably set to 15 to 40 Å. If this value is smaller than 15 Å, the soft magnetic layer 20 and the ferromagnetic layer 40 which are disposed through the non-magnetic metal layer are exchange-coupled to each other, so that the spins of the soft magnetic layer 20 and the ferromagnetic layer 40 do not function independently of each other. If this value exceeds 40 Å, the rate of the electrons which are scattered at the interface between the soft magnetic layer 20 and the ferromagnetic layer 40 disposed at the upper and lower sides respectively are reduced, so that the MR ratio is reduced.

It is necessary that the foregoing layers are laminated at least in the order of the pinning layer 50, the ferromagnetic layer 40, the non-magnetic metal layer 30 and tne soft magnetic layer 20 from the side of the substrate 5. This laminating order comes from the limitation of the pinning layer 50. Specifically, by first laminating the pinning layer 50 on the substrate 5, antiferromagnetism of the iron oxide thin film being the pinning layer 50 can be fully realized. Further, in view of achieving a greater MR ratio, a laminate structure, including a pinning layer, a ferromagnetic layer, a non-magnetic metal layer, a soft magnetic layer, a non-magnetic metal layer, a ferromagnetic layer and a pinning layer, on the substrate 5 is, of course, possible.

The protection layer 80 is provided to prevent oxidation of the surface of the magnetic multilayer film in a film-forming process and improve wettability with electrode material formed thereon and adhesive strength. The protection layer 80 is formed of Ti, Ta, W, Cr, Hf, Zr, Zn or the like. The thickness thereof is generally set to about 30 to 300 Å.

The substrate 5 is formed of glass, silicon, MgO, GaAs, ferrite, AlTiC, $CaTiO_3$ or the like, and the thickness thereof is generally set to about 0.5 to 10 mm.

The material of each layer and the thickness thereof are specified as described above, and an external magnetic field is applied in a direction within the film surface as described later at the film formation time of at least the soft magnetic layer 20 to apply anisotropic magnetic field Hk of 2 to 20 Oe, preferably 2 to 16 Oe, and more preferably 2 to 10 Oe. With this operation, the magnetic multilayer film thus formed has an MR change curve in which the MR slope at a rise-up portion is equal to 0.5%/Oe or more, particularly 0.8%/Oe or more, usually 0.5 to 1.5%/Oe. The maximum hysteresis width of the MR change curve is equal to 8 Oe or less, usually 0 to 6 Oe. Furthermore, the MR slope under the high-frequency magnetic field of 1 MHz can be set to 0.7%/Oe or more, more preferably 0.8%/Oe or more, usually 0.7 to 1.5%/Oe. Accordingly, when it is used for a reading MR head or the like for the high-density recording, a sufficient performance can be obtained. If the anisotropic magnetic field Hk of the soft magnetic layer is lower than 2 Oe, it is equal to the same degree of the coercive force, and no linear MR change curve can be substantially obtained in the vicinity of zero magnetic field, so that the characteristic as the MR element is deteriorated. On the other hand, if it is higher than 20 Oe, the MR slope becomes small and when this film is applied to the MR head or the like, the output is liable to be reduced and the resolution is reduced. The value Hk as described above can be obtained by applying the external magnetic field of 10 to 300 Oe at the film formation. If the external magnetic field is no greater than 10 Oe, it is too insufficient to induce Hk. On the other hand, if it exceeds 300 Oe, the effect is not improved although a coil must be designed in large size due to an occurrence of magnetic field. Therefore, the cost is increased and thus it is inefficient.

When the maximum resistivity is represented by $\rho_{max}$ and the minimum resistivity is represented by $\rho_{sat}$, the MR ratio is represented as $(\rho_{max}-\rho_{sat})\times 100/\rho_{sat}$ (%). The maximum hysteresis width corresponds to the maximum value of the hysteresis width which is calculated by measuring the magnetoresistance change curve (MR curve). The MR slope corresponds to the maximum value of differential values at −20 to +20 Oe which is obtained by measuring the MR curve and calculating a differential curve. The high-frequency MR slope corresponds to an MR slope which is obtained by measuring the MR ratio under an alternating current magnetic field of 6 Oe magnetic width at 1 MHz.

The magnetic multilayer film 1 may be repetitively laminated to form a magnetoresistance effect element. In this case, the repetitive lamination frequency n of the magnetic multilayer film is not limited to a specific value, and it may be suitably selected in accordance with a desired magnetoresistance ratio, etc. In order to satisfy the present requirement for ultrahigh densification of the magnetic recording, the smaller total film thickness of the magnetic multilayer film is better. However, if the film is thinner, the MR effect is usually reduced. The magnetic multilayer film of this invention can be used in practice to a sufficient level, even when the repetitive lamination frequency n is 1. Furthermore, as the lamination frequency is increased, the magnetoresistance ratio increases while productivity is lowered. If n is excessively large, the resistance of the whole element is excessively low, and it is practically inconvenient. Therefore, usually, n is preferably set to 10 or less. The long-period structure of lattices can be confirmed on the basis of appearance of primary and secondary peaks in accordance with a repetitive period in a small-angle X-ray diffraction pattern. When it -is applied to a magnetoresistance device such as an MR head or the like for ultrahigh density magnetic recording, n is preferably set to 1 to 5.

In order to minimize the repetitive lamination frequency n as much as possible, a structure having, from the side of the substrate, a pinning layer, a ferromagnetic layer, a non-magnetic metal layer, a soft magnetic layer, a non-magnetic metal layer, a ferromagnetic layer and a pinning layer, that is, having one soft magnetic layer and two pinning layers, is preferable.

The formation of the foregoing magnetic multilayer film 1 may be performed by an ion-beam sputtering method, a sputtering method, a deposition method, a molecular beam epitaxy (MBE) method or the like. As the substrate 5, glass, silicon, MgO, GaAs, ferrite, AlTiC, $CaTiO_3$ or the like may be used. For the film formation, it is preferable that an external magnetic field of 10 to 300 Oe is applied in a direction within the film plane at the time of film formation of the soft magnetic layer 20. With this operation, Hk can be provided to the soft magnetic layer 20. The application of the external magnetic field may be performed at only the film formation time of the soft magnetic field, for example, using a device which is equipped with an electromagnet or the like which is capable of easily controlling an application timing of the magnetic field, and no external magnetic field is applied at the film formation time of the pinning layer 50. Alternatively, a method of applying a constant magnetic field at the film formation time at all times may be used.

Next, the invention of the magnetoresistance effect element having the magnetic multilayer film 1 as described in the foregoing embodiment has been developed and a path through which electrons flow has been considered in detail, thereby achieving the invention of a magnetoresistance device. The magnetoresistance device as described here includes a magnetoresistance effect element, conductive films and electrode portions. More specifically, it is a device which is expressed with a broad conception covering a magnetoresistance effect type head (MR head), an MR sensor, a ferromagnetic memory element, an angle sensor or the like.

In the following description, a magnetoresistance effect type head (MR head) will be picked up and described as an example of the magnetoresistance device.

Figure 4:
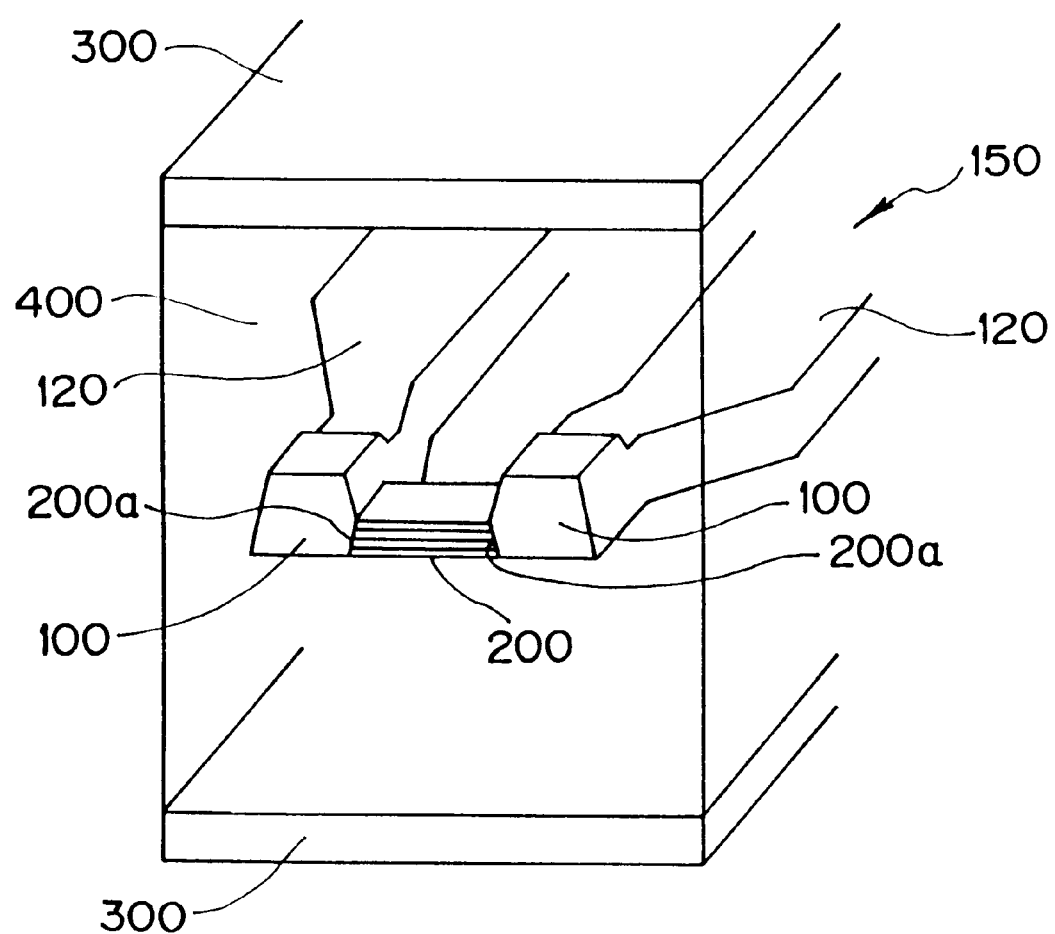
FIG. 4 is a partially omitted sectional view showing an example of a magnetoresistance device according to the present invention.

As shown in FIG. 4, a magnetoresistance effect type head (MR head) 150 includes a magnetoresistance effect element 200 serving as a magnetically-sensitive portion for magnetically sensing a signal magnetic field, and electrode portions 100. 100 which are formed at both end portions 200a, 200a of the magnetoresistance effect element 200. Preferably, the whole both end portions 200a, 200a of the magnetoresistance effect element 200 serving as the magnetically-sensitive portion are connected to the electrode portions 100, 100. Conductive films 120, 120 are electrically conducted to the magnetoresistance effect element 200 through the electrode portions 100, 100. In this invention, the conductive film 120 and the electrode portion 100 are individually shown to simplify the description which will be made later, while in most cases the conductive film 120 and the electrode portion 100 are formed integral with each other by a thin film forming method. Accordingly, these elements may be considered as being formed of one member.

The magnetoresistance effect element 200 serving as the magnetically-sensitive portion of the MR head has substantially the same laminate structure as the magnetoresistance effect element 3 having the magnetic multilayer film 1 shown in FIG. 1. That is, the magnetoresistance effect element 200 is replaced by the magnetoresistance effect element 3 having the magnetic multilayer film shown in FIG. 1, so that the magnetoresistance effect element 200 includes a non-magnetic metal layer 30, a ferromagnetic layer 40 formed on one surface of the non-magnetic metal layer 30, a soft magnetic layer 20 formed on the other surface of the non-magnetic metal layer 30, and a pinning layer 50 formed on the ferromagnetic layer 40 (on a surface opposite to a surface abutting the non-magnetic metal layer 30) to pin the magnetization direction of the ferromagnetic layer 40.

The important point is that the thus formed magnetoresistance effect element 200 exhibits the so-called spin-valve type magnetoresistance change. The spin-valve type magnetoresistance change represents that, in the magnetic multilayer film having the non-magnetic metal layer 30, the ferromagnetic layer 40 formed on one surface of the non-magnetic metal layer 30, the soft magnetic layer 20 formed on the other surface of the non-magnetic metal layer 30 and the pinning layer 50 formed on the ferromagnetic layer for pinning the magnetization direction of the ferromagnetic layer 40, an angle formed between the spin of the soft magnetic layer 20 and the spin of the pinned ferromagnetic layer 40 is set to approximately 90 degrees in an acute angle when the external signal magnetic field is zero. In practice, the angle may be 45 to 90 degrees, and preferably 60 to 90 degrees. Since the pinning action is achieved by the direct exchange interaction between ferromagnetic layer 40 and the pinning layer 50, and particularly, the direct exchange interaction between the antiferromagnetic layer and the ferromagnetic layer in the present invention, the magnetoresistance effect curve (MR curve) is asymmetrical relative to the plus and minus external magnetic fields with respect to the zero external magnetic field.

As shown in FIG. 4, in the magnetoresistance effect type head (MR head) 150, shield layers 300, 300 are formed so as to sandwich the magnetoresistance effect element 200 and the electrode portions 100, 100 at the upper and lower sides, and a non-magnetic insulation layer 400 is formed at a portion between the magnetoresistance effect element 200 and the shield layers 300, 300.

The same materials and thicknesses as described in the foregoing embodiment of the magnetic multilayer film are preferably used for the ferromagnetic layer 40, the non-magnetic metal layer 30, the soft magnetic layer 20 and the pinning layer 50 used in the magnetoresistance effect element 200 as the magnetically-sensitive portion.

The detailed review has been made on the path of current flowing in the magnetic multi layer film of the magnetoresistance effect element 200, and as a result of the review, it has been found out that the electrons as current intensively flow through a certain portion in the magnetic multilayer film. Specifically, among the respective layers forming the magnetic multilayer film, iron oxide forming the pinning layer 50 is approximate to an insulating layer. Accordingly, the electrons intensively flow through the soft magnetic lever 20 and the non-magnetic layer 30 each having a low resistivity. In the MR head using the conventional spin-valve film, a non-magnetic metal layer, a ferromagnetic layer and a pinning layer are laminated in the order named after formation of a soft magnetic layer as a magnetically-sensitive portion, and then an electrode is formed on the upper surface of the pinning layer. In this structure, the electrode is contacted with the pinning layer having a quite large resistivity, so that it is difficult for sense current for measurement (constant current necessary for operating the MR head) to flow. Furthermore, the contact resistance is large and the yield on the manufacturing process is reduced.

These problems can be solved by reversing the lamination order so as to arrange the pinning layer 50 of iron oxide approximate to the insulating layer to be closer to the substrate 5, and by designing the current-flowing electrode portions 100 so that both end portions 200a, 200a thereof are wholly contacted with the magnetoresistance effect element 200 in the laminate direction as shown in FIG. 4. Specifically, the electrons intensively flow through the portion sandwiched between the soft magnetic layer 20 and the ferromagnetic layer 40. At this time, the electrons are magnetically scattered in accordance with the spin directions of the soft magnetic layer 20 and the ferromagnetic layer 40, so that the resistance is greatly varied. Accordingly, a fine change of the external magnetic field can be detected as a large change of electrical resistance.

As described above, at least at the film formation time of the soft magnetic layer 20, the external magnetic field is applied in one direction within the film plane to induce anisotropic magnetic field Hk, thereby making the high-frequency characteristic excellent. Here, the external magnetic field is applied in such a direction that an electric current flows to induce the MR effect in the magnetic multilayer, thereby inducing the anisotropic magnetic field. Usually, the magnetic multilayer film is processed in a strip form, and the electric current is controlled to flow along the longitudinal direction of the magnetic multilayer film. Therefore, it is best to perform the film formation while applying the magnetic field in the longitudinal direction. In other words, it is preferable that the film formation is performed while the magnetic field is applied in the same direction as the electric current flow of the MR head, that is, in a direction which is perpendicular to the signal magnetic field direction and is an in-plane direction. Accordingly, in the soft magnetic layer constituting the magnetic multilayer film in the shape of the strip, the longitudinal direction thereof becomes a magnetization-easy direction, and the short-side direction thereof becomes a magnetization-hard direction, so that anisotropic magnetic field Hk occurs. In this case, since the signal magnetic field is applied in the short-side direction of the magnetic multilayer film in the shape of the strip, the high-frequency magnetic characteristic of the soft magnetic layer is improved, and the large MR characteristic in a high frequency area can be obtained. It is preferable that the magnitude of the applied magnetic field is in the range of 10 to 300 Oe. The anisotropic magnetic field Hk which is induced in the soft magnetic layer 20 is in the range of 3 to 20 Oe, preferably 3 to 16 Oe, more preferably 3 to 12 Oe. If the anisotropic magnetic field Hk is lower than 3 Oe, it is equal to the same degree as the coercive force of the soft magnetic layer 20, so that no linear MR change curve can be substantially obtained in the vicinity of the zero magnetic field. Therefore, the characteristic as the MR head is deteriorated. On the other hand, if the anisotropic magnetic field Hk is higher than 20 Oe, the MR slope (MR ratio per unit magnetic field) is reduced, so that the output is liable to be reduced and the resolution is reduced when it is used as the MR head or the like. The film of the present invention exhibits high heat resistance, and its MR slope at the rise-up portion of the MR change curve is 0.5%/Oe or more, particularly 0.8%/Oe or more, usually 0.5 to 1.5%/Oe. The maximum hysteresis width of the MR change curve is equal to 8 Oe or less, usually 0 to 6 Oe. In addition, the MR slope at the high-frequency magnetic field of 1 MHz can be equal to 0.7%/Oe or more, preferably 0.8%/Oe or more, usually 0.7 to 1.5/Oe. Therefore, sufficient performance can be obtained as the reading MR head or the like for the high density recording.

Furthermore, when forming the pinning player 50, the magnetic field is preferably applied in a direction perpendicular to the direction of the magnetic field applied at the film formation time of the soft magnetic film 20. Specifically, it is applied within the film plane of the magnetic multilayer film and in a direction orthogonal to the measurement current. The magnitude of the applied magnetic field is preferably set in the range of 10 to 300 Oe. With this operation, the magnetization direction of the ferromagnetic layer 40 is surely fixed in the applied magnetic field direction (direction perpendicular to the measurement current) by the pinning layer 50, whereby the magnetization of the ferromagnetic layer can be most reasonably set to be antiparallel to the magnetization of the soft magnetic layer 20 whose direction can be freely changed by the signal magnetic field. However, this is not a necessary condition, and the direction of the magnetic field to be applied at the film formation time of the antiferromagnetic layer may be coincident with the direction of the magnetization of the magnetic field to be applied at the film formation time of the soft magnetic layer. At this time, it is preferable that the temperature is decreased while applying the magnetic field in a strip short-side direction (direction perpendicular to the direction of the applied magnetic field when the soft magnetic layer 20 is formed), when the heat treatment at about 200° C. is carried out in the process after the magnetic multilayer film is formed.

The rise-up portion of the MR curve is determined by the rotation of the magnetization of the soft magnetic layer 20. In order to obtain a sharper rise-up of the MR curve, it is preferable that the magnetization direction of the soft magnetic layer 20 is perfectly varied due to the magnetization rotation in accordance with the signal magnetic field. However, actually, magnetic domains occur in the soft magnetic layer 20, and a movement of domain wall and a magnetization rotation occur simultaneously, so that Barkhausen noises are produced and thus the MR head characteristic is not stabilized.

Figure 5:
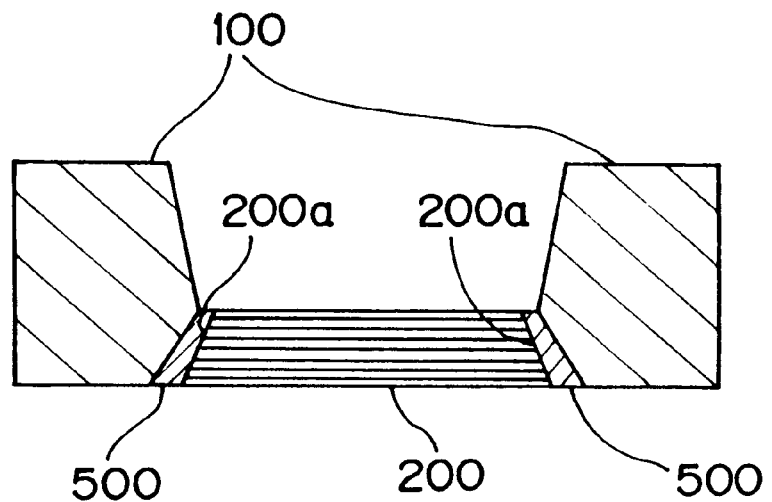
FIG. 5 is a sectional view showing a structure of a magnetoresistance effect element (magnetic multilayer film) and electrode portions of a magnetoresistance device according to the present invention.

Accordingly, as a result of inventor's earnest studies, it has been found out that the noises can be reduced by interposing a linking soft magnetic layer 500 between the magnetoresistance effect element 200 and each of the electrode portions 100 through which the measurement current flows, as shown in FIG. 5. Of course, in this case, the linking soft magnetic layers 500 are in contact with the whole end portions 200a, 200a of the magnetoresistance effect element 200. The linking soft magnetic layers 500, 500 which are formed adjacent to the magnetoresistance effect element (magnetic multilayer film) are in direct magnetic contact with the soft magnetic layer constituting the magnetic multilayer film. The added linking soft magnetic layer 500 causes the magnetic domains of the soft magnetic layer in the magnetic multilayer film to approach a magnetic monodomain structure and stabilizes the magnetic domain structure. As the result, the soft magnetic layer in the magnetic multilayer film acts in a magnetization rotation mode relative to the signal magnetic field, and an excellent characteristic having no noise can be obtained.

Figure 6:
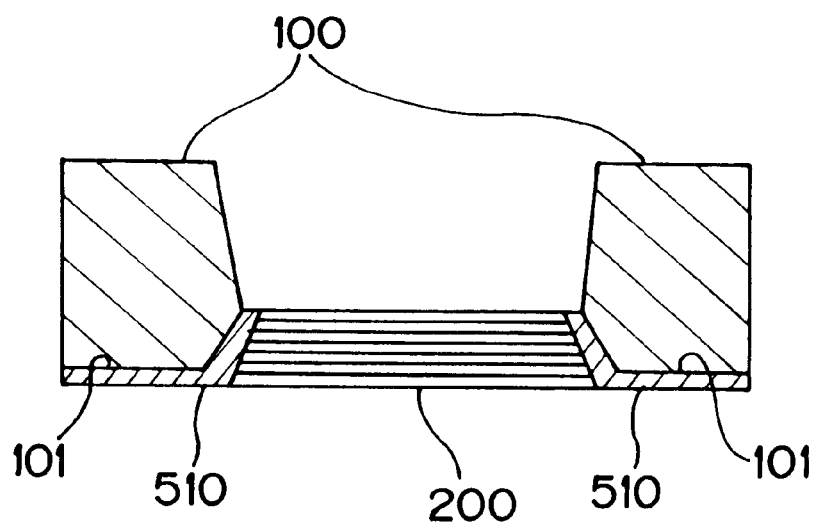
FIG. 6 is a sectional view showing another example of a structure of a magnetoresistance effect element (magnetic multilayer film) and electrode portions of a magnetoresistance device according to the present invention.

In order to cause the magnetic domains of the soft magnetic layer in the magnetic multilayer film to approach the magnetic monodomain and stabilize the magnetic domain structure, linking soft magnetic layers 510, 510 having such a shape as shown in FIG. 6 are preferably provided. The linking soft magnetic layers 510 are formed not only between the magnetoresistance effect element 200 serving as the madgnetically-sensitive portion and the electrode portions 100, but also on the lower surfaces 101 of the electrode portions 100 continuously. This is because the degree of stabilization is larger as the volume of the linking soft magnetic layer 510 to stabilize the magnetic domain structure increases. In addition, if it is directly contacted with the electrode portion 100, there occurs no voltage effect, and it is favorable because the MR effect of the magnetic-domain stabilizing linking soft magnetic layer itself has no effect on the MR effect of the magnetic multilayer film. Furthermore, in order to further positively stabilize the magnetic domains of the soft magnetic layer in the magnetic multilayer film, an antiferromagnetic layer may be interposed between the electrode portions 100 and the linking soft magnetic layers to stabilize the magnetic domain structure.

Figure 21:
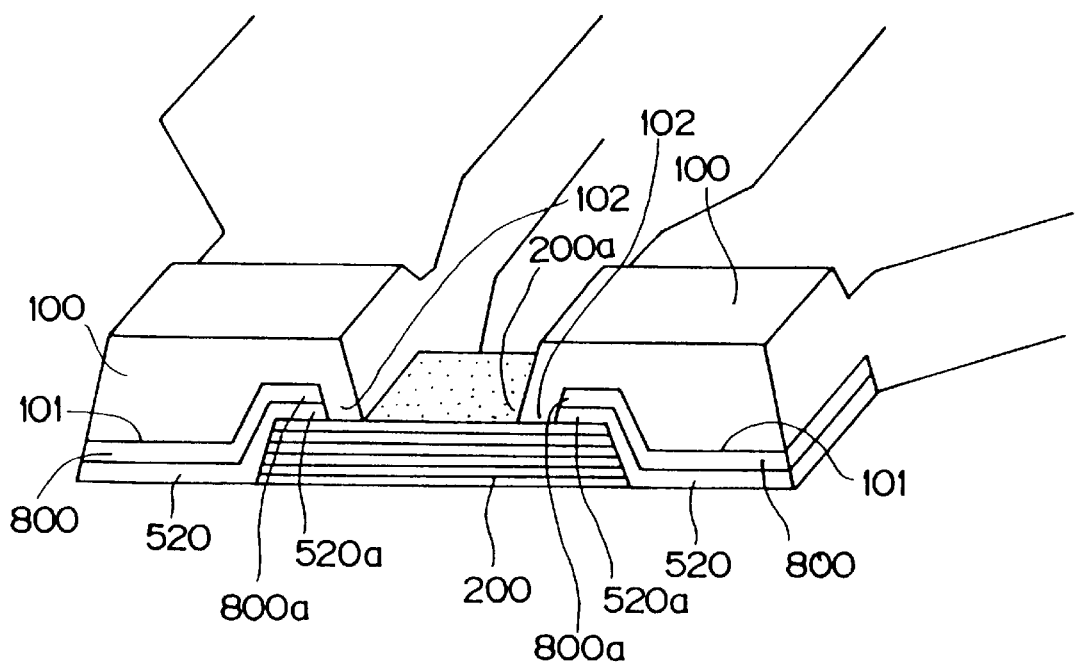
FIG. 21 is a schematic perspective view showing a preferred connection state of a magnetoresistance effect element (magnetic multilayer film) and electrode portions of a magnetoresistance device according to the present invention.

It is particularly preferable that the hematite-using type spin-valve MR head using hematite as the pinning layer as in the present invention has a head structure as shown in FIG. 21. Specifically, between the magnetoresistance effect element 200 working as a magnetically-sensitive portion and the electrode portions 100 for conducting the measurement current, linking soft magnetic layers 520 and antiferromagnetic layers 800 (or hard magnetic layer 800) are interposed in order from the side of the magnetoresistance effect element 200 as shown in the drawing. Further, the linking soft magnetic layer 520 and the antiferromagnetic layer 800 (or hard magnetic layer 800) are formed such that their one end side covers a portion of an upper side 200a (near the soft magnetic layer) of the magnetoresistance effect element 200 and their other end side gets under a lower surface 101 of the electrode portion 100 as shown in the drawing. Further, an end portion 102, located at the head center side, of the electrode portion 100 is formed so as to cover a portion of the upper side 200a (near the soft magnetic layer) of the magnetoresistance effect element 200 and also cover upper end portions 520a, 800a of the linking soft magnetic layer 520 and the antiferromagnetic layer 800, respectively.

With such an arrangement, through effects of both the linking soft magnetic layers 520 and the antiferromagnetic layers 800 formed at the magnetoresistance effect element 200, the longitudinal bias can be given quite efficiently so that the MR head which can suppress the Barkhausen noises can be achieved. Further, since the end portions 102 of the electrode portions 100 are formed so as to cover the magnetoresistance effect element 200, the MR head can be provided wherein the signal magnetic field is not lowered at the end portions of the element, and further, the formation of narrow track width, such as no greater than 1 μm, is easy.

In general, in an MR head using permalloy, a shunt rayer formed of Ti or the like and a bias magnetic-field applying layer of soft magnetic material having high resistivity such as CoZrMo, NiFeRh or the like, are usually provided adjacent to the magnetically-sensitive portion. These are called soft film bias or shunt bias, and act to shift the curve of permalloy and produce a linear area in the vicinity of the zero magnetic field. However, the mechanism of this phenomenon is complicated, and it is actually a factor of greatly reducing the manufacturing yield. On the other hand, in the magnetoresistance effect element (magnetic multilayer film) of the present invention as described above, the MR curve rises up just in the vicinity of the zero magnetic field, so that a linear area can be produced in the vicinity of the zero magnetic field by a self-bias which is caused by electric current flowing in the magnetoresistance effect element (magnetic multilayer film). As the result, a biasing means having a complicated mechanism is not required, so that the manufacturing yield can be improved, the manufacturing time can be shortened and the cost can be reduced. Furthermore, the thickness of the magnetically-sensitive portion is thinner because no biasing mechanism is required, so that the shield thickness is made thin when it is used as the MR head, and it is greatly effective to shorten the wavelength of signals for the ultrahigh density recording.

When these MR heads are manufactured, heat treatments such as baking, annealing, resist curing, etc. are indispensable for a patterning process, a flattening process, etc. in the manufacturing process.

In general, a problem of heat-resistance frequently occurs in the magnetoresistance effect element having the magnetic multilayer film, which is called artificial lattices, due to the thickness of each layer. According to the magnetoresistance effect element (magnetic multilayer film) of the present invention, the magnetic field is applied to provide anisotropic magnetic field in the magnetic layer, so that, after the film formation, it can endure a heat treatment at a temperature 300° C. or less, generally 100 to 300° C. for about one hour. The heat treatment is generally performed under vacuum, inert gas atmosphere, or atmospheric air. Particularly, if the heat treatment is conducted under a vacuum (pressure-reduced) state at $10^{-7}$ Torr or less, a magnetoresistance effect element (magnetic multilayer film) whose characteristic is extremely less deteriorated can be obtained. Furthermore, the MR characteristic is little deteriorated even by lapping or polishing in the processing step.

It may be arranged that, after formation of the iron oxide layer being the pinning layer 50, the substrate is taken out from a vacuum film forming apparatus, then it is subjected to a heat treatment at temperature of 100° C. to 300° C. in the atmosphere, under oxygen or in the vacuum so as to approach the hematite phase, and thereafter, the substrate is returned into the vacuum film forming apparatus so as to form the remaining spin-valve structure (remaining laminate film structure). Since Fe ion and O ion large differ in size, distortion tends to occur due to stress or the like caused by the vacuum film formation. Through the heat treatment, the characteristic in antiferromagnetism can be improved due to relaxation of the stress and improvement in regularity of the crystal lattices. Although it is preferable to perform the heat treatment in the atmosphere after the formation of the pinning layer, the effect is large even in the vacuum, and thus, at least after the formation of the pinning layer, the heat treatment may be performed at temperature of 100° C. to 300° C. in a desired step.

Since the iron oxide thin film of $FeO_x$ (material forming the pinning layer) in the present invention is a high voltage proof insulating layer, it can also be used as a material for forming a so-called gap film of the MR head.

The invention of the magnetoresistance effect element and the invention of the magnetoresistance device (for example, MR head) will be described in more detail using the following examples. First, an example of the invention of the magnetoresistance effect element 3 having the magnetic multilayer film 1 (corresponding to FIG. 1) is described as an example 1.

EXAMPLE 1

A glass substrate was used as the substrate. The glass substrate was placed in an ion-beam sputtering device, and evacuated until $2.3 \times 10^{-7}$ Torr. The substrate was cooled and kept at 14° C., and an artificial lattice magnetic multilayer film having the following composition was formed on the substrate being rotated at 20 r.p.m. At this time, the film formation was carried out at a film growth rate of about 0.3 Å/second or less while a magnetic field was applied in the plane of the substrate and in a direction parallel to a measurement electric current.

After the film formation, the resultant was cooled from 200° C. under a vacuum of $10^{-5}$ Torr while a magnetic field of 200 Oe was applied in a direction perpendicular to the measurement electric current and in the in-plane direction, thereby inducing a pinning effect in the ferromagnetic layer. Samples 1-1 to 1-13 of magnetoresistance effect elements shown in Table 1 were prepared in the manner as described above.

TABLE 1

| Sample No | Main Power (accelerating voltage, ion current) | Assist Power (accelerating voltage, ion current) | Assist Gas Flow Rate (Ar, $O_2$) | Oxidation Degree X (O/Fe) | Hua (Oe) |
|---|---|---|---|---|---|
| 1-1* | (1200, 120) | (100, 10) | (4, 1) | 1.30 | 31 |
| 1-2 | (1200, 120) | (100, 10) | (8, 2) | 1.41 | 102 |
| 1-3 | (1200, 120) | (100, 10) | (16, 4) | 1.40 | 95 |
| 1-4* | (1200, 120) | (100, 10) | (24, 6) | 1.32 | 35 |
| 1-5 | (1200, 120) | (80, 10) | (7, 3) | 1.47 | 110 |
| 1-6* | (1200, 120) | (80, 30) | (6, 5) | 1.28 | 24 |
| 1-7* | (600, 60) | (100, 4) | (8, 2) | 1.27 | 22 |
| 1-8 | (1200, 120) | (130, 10) | (7, 3) | 1.37 | 86 |
| 1-9* | (900, 120) | (180, 10) | (6, 4) | 1.11 | 13 |
| 1-10 | (1200, 120) | (90, 12) | (8, 2) | 1.43 | 106 |
| 1-11* | (1200, 120) | (100, 18) | (8, 2) | 1.31 | 31 |
| 1-12* | (1200, 120) | (50, 6) | (6, 4) | 1.21 | 19 |
| 1-13 | (1200, 120) | (90, 9) | (7, 3) | 1.55 | 90 |

*outside scope of the present invention (comparative example) unit of accelerating voltage: eV, unit of ion current: mA, unit of assist gas flow rate: sccm In Table 1, for example, sample 1-1 was a magnetic multilayer film obtained by forming a 1,000 Å-thickness pinning layer of FeO. on a substrate, and then by successively sputtering a 38 Å-thickness ferromagnetic layer of a permalloy composition (NiFe) alloy containing Ni81%-Fe19% and an 88 Å-thickness non-magnetic metal layer of Cu, under a condition of accelerating voltage 1,200 eV and ion current 120 mA of a main gun and accelerating voltage 100 eV, ion current 10 mA, Ar flow rate 4 sccm and $O_2$ flow rate 1 sccm of an assist beam. The other samples 1-2 to 1-13 differ only in film forming condition of the $FeO_x$ pinning layer (thus, compositions of $FeO_x$ differ from each other) and, other than that, have the same laminate structure as sample 1-1.

For the respective samples, Table 1 shows values of the accelerating voltage and the ion current of the used main gun, the accelerating voltage and the ion current of the used assist gun, the Ar and $O_2$ gas flow rates fed to the assist gun, x (referred to as oxidation degree) representing a ratio of O/Fe forming the $FeO_x$ pinning layer, one-way anisotropy Hua (shift amount of the center of hysteresis from the zero magnetic field on the magnetization curve: uniaxial anisotropy) caused by the pinning layer exhibiting antiferromagnetism. The oxidation degree x can be easily determined by X-ray fluorescence analysis. Concerning Hua as a parameter of intensity of antiferromagnetism, an iron oxide thin film ($FeO_x$ pinning layer) and a ferromagnetic layer were prepared under the same film forming condition and with the same thicknesses of the respective layers as manufacturing the MR head, a magnetization curve thereof was measured, and Hua was estimated by a shift amount of the center magnetic field of hysteresis. As the result, it was found out that sufficient Hua can be achieved for operating the MR head by adjusting the oxidation degree x within the range of $1.35 \leq x \leq 1.55$ (unit: atomic ratio).

From the results of experiment where the assist gas flow rates were changed as shown by samples 1-1 to 1-4 in Table 1, it is seen that only those pinning layers (samples 1-2 and 1-3) formed with the $Ar+O_2$ gas flow rates of the assist gun within the range of 6 to 20 sccm have values of oxidation degree $x=O/Fe$ which are within the range of 1.35 to 1.55. In this case, the one-way anisotropy Hua takes values greater than 40 Oe which is considered to be necessary at minimum.

Samples 1-5, 1-6, 1-7, 1-10 and 1-11 correspond to the present examples and comparative examples, wherein the ion current of the assist beam was changed variously. From the results of experiment, it is seen that the ion current of the assist beam should be within the range of 5 to 15 mA (samples 1-5 and 1-10).

Further, from the results of experiment of samples 1-5, 1-7 to 1-9 and 1-12, it is seen that sufficient Hua can not be obtained if the accelerating voltage of the assist beam is too high, i.e. 180 eV, or too low, i.e. 50 eV. Accordingly, it is seen that the accelerating voltage should be within the range of 60 to 150 eV.

Figure 7:
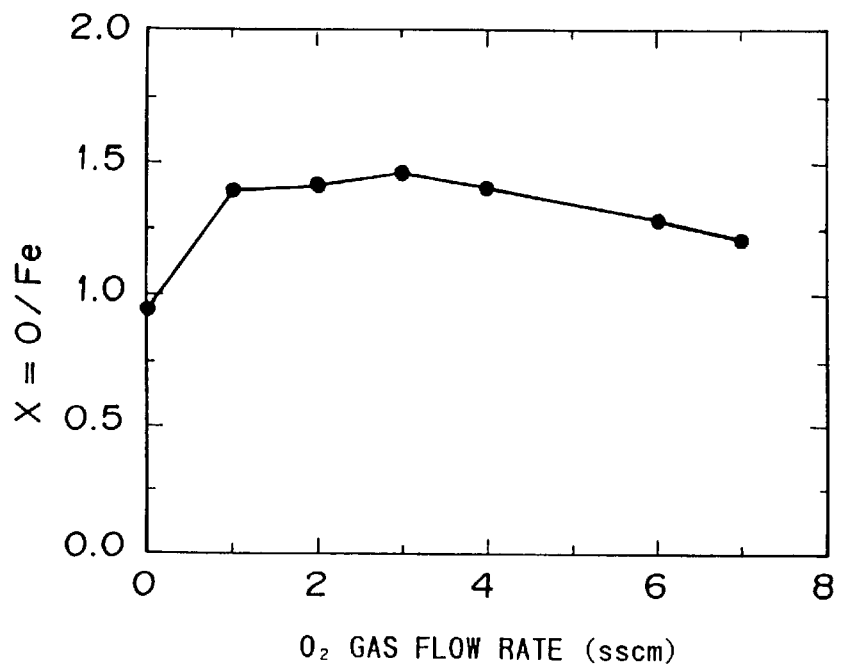
FIG. 7 is a graph showing a relationship between $O_2$ flow rates of an assist beam and oxidation degrees of a pinning layer in a magnetoresistance effect element (magnetic multilayer film) according to the present invention.

FIG. 7 shows a relationship between a variation of the $O_2$ flow rate and the oxidation degree $x=O/Fe$ when the $Ar+O_2$ gas flow rate of the assist gun is fixed to 10 sccm. In this drawing, for example, when the $O_2$ flow rate is 4 sccm, the Ar flow rate is 6 sccm. For examining the effect of antiferromagnetism of $FeO_x$, estimation was performed using films laminated from the side of the substrate in the order of $FeO_x$ (1,000 Å)—NiFe(38 Å)—Cu(88 Å). As clear from the results of FIG. 7, when the $O_2$ flow rate is 1 to 5 sccm, x is within the range of 1.35 to 1.55. Specifically, it was confirmed that, when the $Ar:O_2$ flowratio is 1:1 to 9:1, x is within the range of 1.35 to 1.55, and Hua takes a large value greater than 40 Oe.

Figure 8:
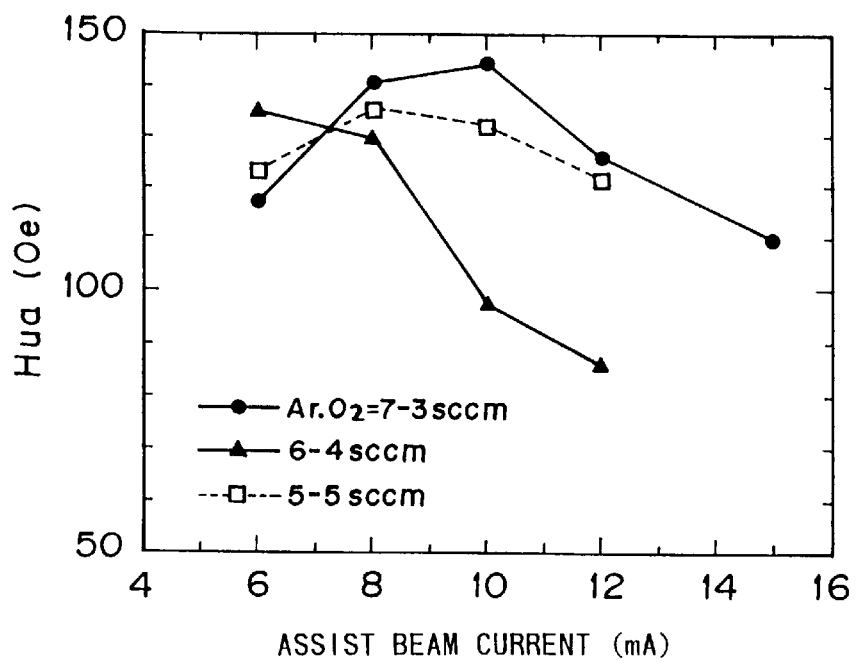
FIG. 8 is a graph showing a relationship between ion current of an assist beam and one-way anisotropic magnetic field in a magnetoresistance effect element (magnetic multilayer film) according to the present invention.

FIG. 8 shows the results of experiment where the Ar and $O_2$ gas flow rates were used as three kinds of parameters (7, 3), (6, 4) and (5, 5) (unit: sccm), and a relationship between a variation of the ion current of the assist beam and the one-way anisotropy Hua was examined for each parameter. Estimation was performed using films laminated from the side of the substrate in the order of $FeO_x$ (1,000 Å)—NiFe (38 Å)—Cu(88 Å). In the experiment, the accelerating voltage of the assist beam was fixed to 100 eV. It is seen from the drawing that large one-way anisotropy was shown in the range of the ion current from 5 to 15 mA although there were some differences depending on the $Ar:O_2$ flow ratios.

Since the point of the present invention resides in formation of iron oxide $FeO_x$ exhibiting antiferromagnetism, identification of the materiality thereof will be explained hereinbelow.

Figure 9:
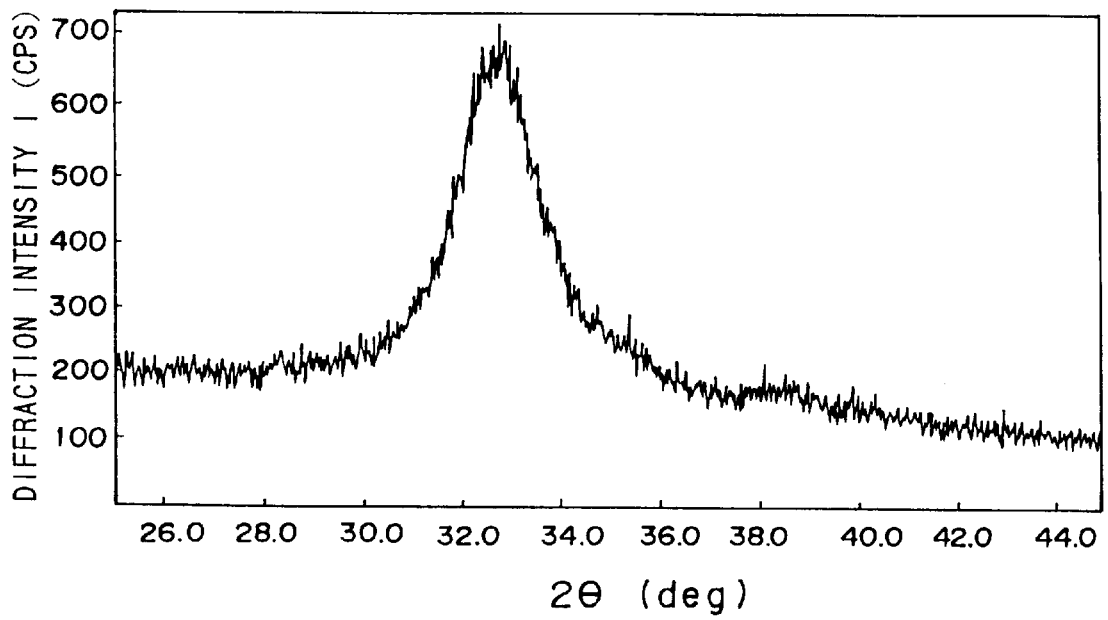
FIG. 9 is a graph showing an X-ray diffraction pattern of a pinning layer in a magnetoresistance effect element (magnetic multilayer film) according to the present invention.

FIG. 9 shows the results of thin film X-ray diffraction of sample 1-5 which showed Hua of 110 Oe in Table 1. From the results, although it was broad, the diffraction peak from the hematite a phase (104) orientation plane was confirmed. Since other diffraction peaks of iron oxide such as magnetite or wustite were not confirmed, it is known that $\alpha$-$Fe_2O_3$ (hematite) was formed as the pinning layer. As the result, the large Hua value of 110 Oe was obtained.

Further, sample 1-2 (Table 1) was cut in a laminating direction and its lamination section was observed by a high-resolution transmission electron microscope (TEM). And, as a result of examining the inside of the pinning layer 50 through electron beam diffraction, presence of the hematite phase was confirmed. In this case, it was found out that a 40 volume % magnetite phase was also present in addition to the hematite phase. However, due to the existence of the 60 volume % hematite phase, Hua showed a practically sufficient value. In the other samples, a 30 volume % hematite phase, a 70 volume % magnetite phase and a small amount of a wustite phase were confirmed. It was confirmed that a value of Hua was not so sufficient, but it was within the range so as to be used as the head. From these results, it was found out that the pinning layer was not necessarily formed of a single layer of hematite, but it was acceptable if the pinning layer contained $\alpha$-$Fe_2O_3$ (hematite) exhibiting antiferromagnetism at least no less than 30 volume % and no more than 60 volume %.

Further, another sample under a different film forming condition, particularly the inside of the pinning layer 50, was observed by the high-resolution transmission electron microscope (TEM). Although the inside of the pinning layer 50 was formed of a single hematite phase, its crystal was an aggregate of 60 to 100 Å microcrystal particles of hematite. In this case, it was confirmed that Hua was 71 Oe, which was not so sufficient but would raise no problem from a practical point of view. Accordingly, it is seen that the pinning layer may be an aggregate of microcrystals equal to 100 Å or less, particularly in the range of 60 to 100 Å, of $\alpha$-$Fe_2O_3$ (hematite) showing antiferromagnetism.

Figure 10:
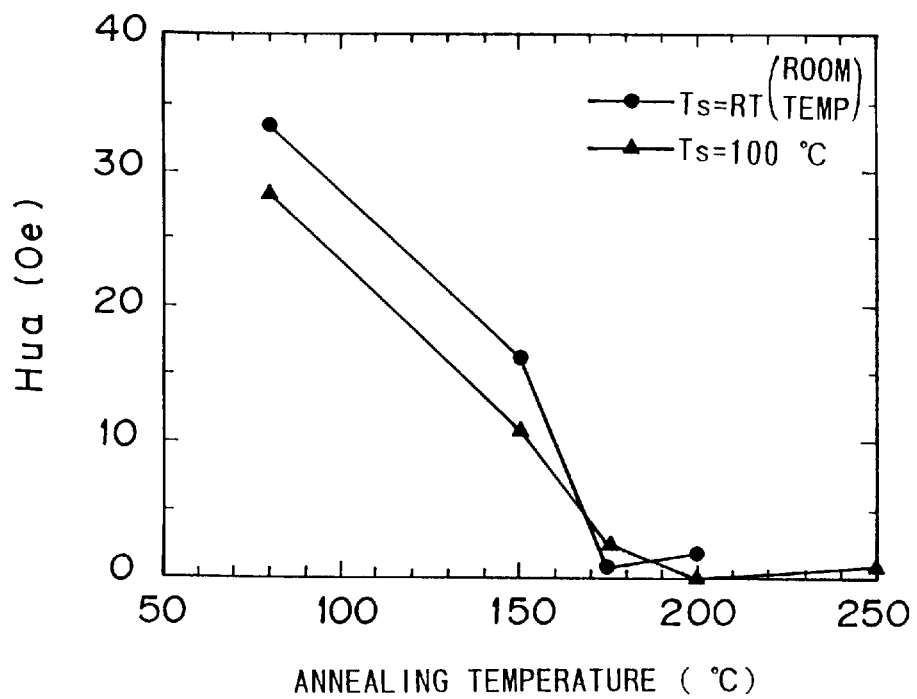
FIG. 10 is a graph showing variation of one-way anisotropic magnetic field relative to temperatures in a magnetoresistance effect element (magnetic multilayer film) according to the present invention.

Now, it will be described whether iron oxide $FeO_x$ showing antiferromagnetism was actually formed. FIG. 10 is a graph showing the results of examining heat resistance of sample 1-5 in Table 1. Hua was decreased as the measurement temperature was increased, and reached substantially 0 at about 200° C. This showed that $FeO_x$ exhibiting antiferromagnetism reduced its pinning effect as the Neel temperature of this layer approached, and finally, the pinning effect was lost. From the results, it was confirmed that the formed iron oxide $FeO_x$ was antiferromagnetic and its Neel temperature was 200° C. Further, as a result of similarly evaluating $FeO_x$ samples under various film forming conditions, it was found out that the Neel temperature of this pinning layer was in the range of 120° C. to 400° C. From the foregoing results and the results shown in Table 1, it is seen that, by forming iron oxide $FeO_x$ as the pinning layer, at $1.35 \leq x \leq 1.55$ (unit: atomic ratio) and with a thickness of 100 Å to 3,000 Å, the magnetization direction of the adjacent ferromagnetic layer can be pinned. Further, it is seen that the pinning layer of $\alpha$-$Fe_2O_3$ (hematite) exhibiting antiferromagnetism, the pinning layer containing $\alpha$-$Fe_2O_3$ (hematite) at least no less than 30 volume % and no more than 60 volume %, the pinning layer being an aggregate of microcrystals equal to 100 Å or less of $\alpha$-$Fe_2O_3$ (hematite) showing antiferromagnetism, or the pinning layer exhibiting antiferromagnetism and whose Neel temperature is 120° C. to 400° C., achieves the similar effects. By sputtering a target of ion oxide using the ion-beam sputtering method and applying an assist beam of mixed gas of Ar and $O_2$ to the substrate to form ion oxide $FeO_x$, the pinning layer exhibiting antiferromagnetism and having the sufficient pinning effect can be formed.

Hereinbelow, characteristic estimation which is common to the respective inventions will be described. A B-H loop was measured by means of a vibrating sample magnetometer. A measurement of resistance was performed as follows: Samples having a shape of 0.4×6 mm were prepared from the samples having the compositions shown in Table 1, and the resistance of each sample was measured by a four-terminal method in which an external magnetic field was applied to the sample in the in-plane direction and in a direction perpendicular to the electric current while the external magnetic field was varied from −300 to 300 Oe. On the basis of the measured resistance, the minimum value of the resistivity $\rho_{sat}$ and the MR ratio $\Delta R/R$ were calculated. The MR ratio $\Delta R/R$ was calculated according to the following equation:

$\Delta R/R = (\rho_{max} - \rho_{sat}) \times 100/\rho_{sat}$ (%), where the maximum resistivity is represented by $\rho_{max}$ and the minimum resistivity is represented by $\rho_{sat}$. Furthermore, the differential curve was obtained from a measured MR curve, and with respect to the rise-up characteristic, the maximum value in the vicinity of the zero magnetic field was estimated as the MR slope (unit: %/Oe). The value of MR slope at 6 Oe width under the high-frequency magnetic field of 1 MHz is required to be 0.7%/Oe or more as described above.

Table 2 shows structures and magnetoresistance ratios of magnetic multilayer films formed by using the foregoing pinning layers and exhibiting the spin-valve type MR changes.

TABLE 2

| Sample No. | Material (m1, m2, m3, m4) | Layer Thickness (t1, t2, t3, t4) | MR (%) | MR Slope (%/Oe) | High-Frequency Slope (1 MHz, %/Oe) |
|---|---|---|---|---|---|
| 2-1 | ($\alpha Fe_2O_3$, CoNiFe, Cu, NiFeCo) | (1000, 32, 22, 77) | 3.8 | 1.8 | 1.7 |
| 2-2 | ($\alpha Fe_2O_3$, CoNiFe, Cu, NiFeCo) | (800, 32, 27, 77) | 2.9 | 1.2 | 1.2 |
| 2-3 | ($\alpha Fe_2O_3$, CoFe, Cu, CoNiFeSiB) | (1000, 25, 25, 67) | 3.5 | 1.6 | 1.5 |
| 2-4 | ($\alpha Fe_2O_3$, CoFe, Cu, CoNiFeSiB) | (1500, 25, 21, 64) | 3.9 | 1.4 | 1.2 |
| 2-5 | ($Fe_2O_3$, Co, Cu, NiFeCo) | (1000, 22, 27, 85) | 2.8 | 1.0 | 1.0 |
| 2-6 | ($\alpha Fe_2O_3$, CoNiFe, Cu, NiFeCo) | (500, 32, 27, 77) | 3.6 | 1.6 | 1.5 |
| 2-7 | ($\alpha Fe_2O_3$, CoNiFe, Cu, NiFeCo) | (200, 32, 27, 77) | 3.0 | 1.2 | 1.0 |
| 2-8* | ($\alpha Fe_2O_3$, CoNiFe, Cu, NiFeCo) | (800, 32, 42, 77) | 1.4 | 0.6 | 0.5 |
| 2-9* | ($\alpha Fe_2O_3$, CoNiFe, Cu, NiFeCo) | (800, 32, 13, 77) | 0.2 | 0.0 | 0.0 |
| 2-10* | ($\alpha Fe_2O_3$, CoNiFe, Cu, NiFeCo) | (70, 32, 33, 77) | 0.2 | 0.0 | 0.0 |
| 2-11* | ($\alpha Fe_2O_3$, CoFe, Cu, CoNiFeSiB) | (1000, 25, 25, 160) | 1.3 | 0.6 | 0.6 |
| 2-12* | ($\alpha Fe_2O_3$, CoFe, Cu, CoNiFeSiB) | (1000, 120, 25, 80) | 1.0 | 0.6 | 0.5 |

*outside scope of the present invention (comparative example)

In Table 2, for example, sample 2-1 was formed of [$\alpha$-$Fe_2O_3$ (1,000)—CoNiFe(32)—Cu(22)—NiFeCo(77)], and it was a magnetic multilayer film formed by disposing, from the side of the substrate, a 1,000 Å-thickness antiferromagnetic layer (pinning layer) of $\alpha$-$Fe_2O_3$, a 32 Å-thickness CoNiFe alloy layer used as a ferromagnetic layer, a 22 Å-thickness non-magnetic metal layer of Cu and a 77 Å-thickness soft magnetic layer of NiFeCo. Materials forming each sample are represented by (m1, m2, m3, m4) in the order of the antiferromagnetic layer (pinning layer), the ferromagnetic layer, the non-magnetic metal layer and the soft magnetic layer. Thicknesses of those layers are represented by (t1, t2, t3, t4) in the same order in Table 2. The composition of the CoNiFe alloy layer used as the ferromagnetic layer was $Co_{88}Ni_6Fe_6$, and the composition of the NiFeCo alloy layer used as the soft magnetic layer was $Ni_{48}Fe_{17}Co_{35}$ (weight %). In the following examples, if not particularly referred to, the compositions of the CoNiFe layer and the NiFeCo layer are the same as those in this example. Further, the MR slopes under the DC magnetic field and the MR slopes (unit: %/Oe) at 6 Oe width under the high-frequency magnetic field of 1 MHz are also shown. As described before, these values are required to be 0.7%/Oe or more.

CoNiFeSiB alloy layers in samples 2-3 and 2-4 shown in Table 2 were amorphous soft magnetic layers whose composition was $Co_{70}Ni_5Fe_5Si_8B_{12}$ (atomic %) in this example.

Sample 2-5 is an example where an $Fe_2O_3$ layer containing a 50 volume % hematite layer was used as the pinning layer. Samples 2-8 and 2-9 (both are comparative examples) are examples where the same multilayer film structure as sample 2-1 was applied, but layer thicknesses (t3) of the non-magnetic metal layers were different. Specifically, in sample 2-8, the MR ratio decreased due to a thickness of the non-magnetic metal layer being too large. On the other hand, in sample 2-9, since the non-magnetic metal layer was too thin, the ferromagnetic coupling between two magnetic layers was increased so as to disable generation of the relative angle between the spins, and thus, the spin-valve type MR change was not shown.

Sample 2-10 (comparative example) is an example where the same multilayer film structure as sample 2-1 was applied, but a layer thickness (t1) of the pinning layer was different. Specifically, in sample 2-10, the MR ratio was decreased since the pinning layer was too thin. This is because, due to the small thickness of the pinning layer, antiferromagnetism of iron oxide $FeO_x$ was not fully realized.

Samples 2-11 and 2-12 (both are comparative examples) are examples where the approximately same multilayer film structure as sample 2-1 was applied, but thicknesses of two magnetic layers exceeded the scope of the present invention. Specifically, in sample 2-11, since a layer thickness (t4) of the soft magnetic layer was too large, the resistivity of the multilayer film was increased so that the MR ratio was rendered small. In sample 2-12, since a layer thickness (t2) of the ferromagnetic layer was too large, the energy of the pinning layer was insufficient so that the spin of the ferromagnetic layer was not fully pinned. As the result, the MR ratios were not sufficient in both samples.

From the results shown in Table 2, it is seen that, by fully realizing the characteristic of antiferromagnetism of iron oxide $FeO_x$ forming the pinning layer and by selecting materials and thicknesses of the ferromagnetic layer, the soft magnetic layer and the non-magnetic metal layer from the ranges disclosed in the present invention, the magnetoresistance effect element can be realized wherein the slope of the magnetoresistance change at 6 Oe under the high-frequency magnetic field of 1 MHz is 0.7%/Oe or greater.

Figure 11A:
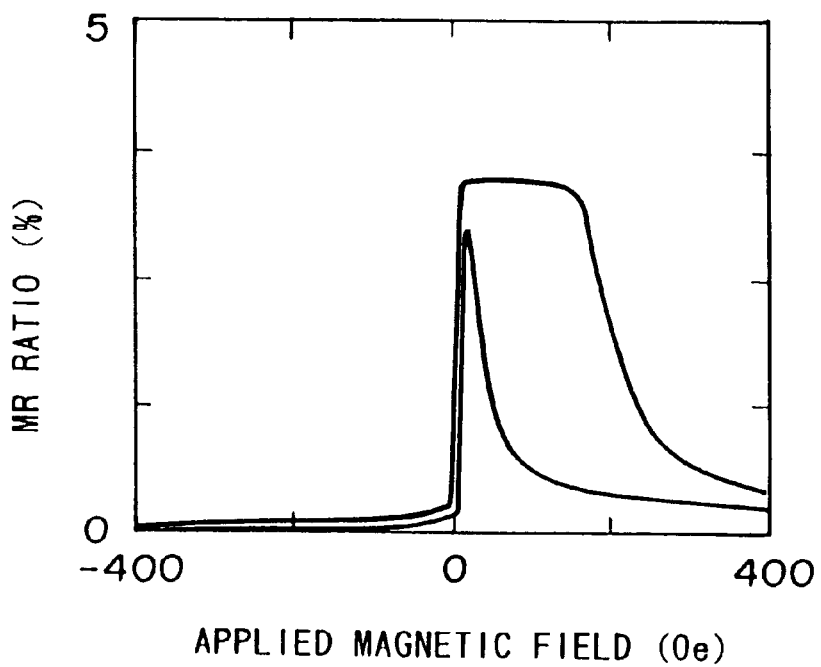
FIG. 11 (A) and (B) are graphs showing an MR curve and a magnetization curve in a DC magnetic field, respectively, of a magnetoresistance effect element (magnetic multi layer film) according to the present invention.
Figure 11B:
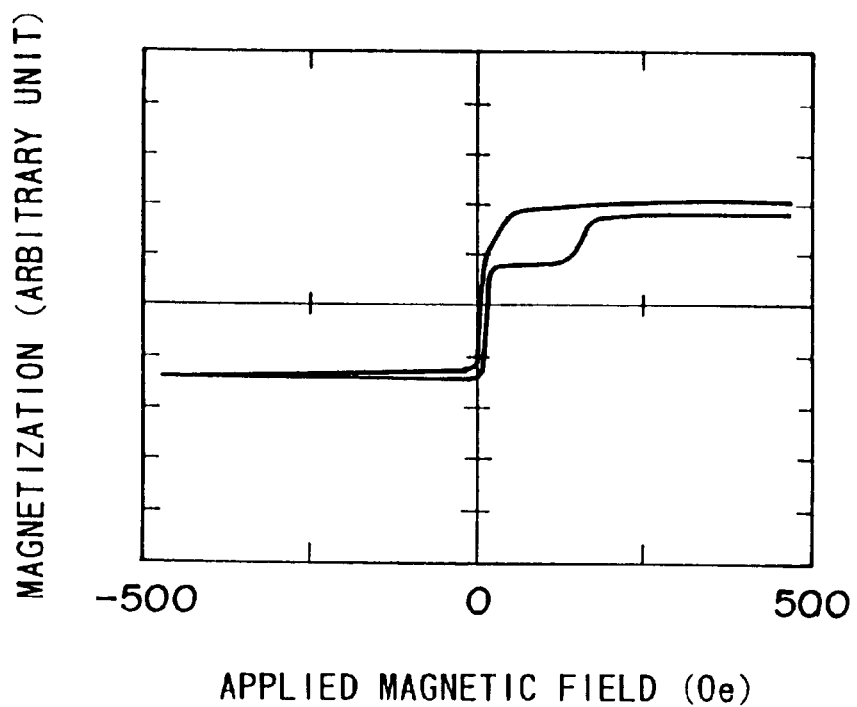
Figure 12:
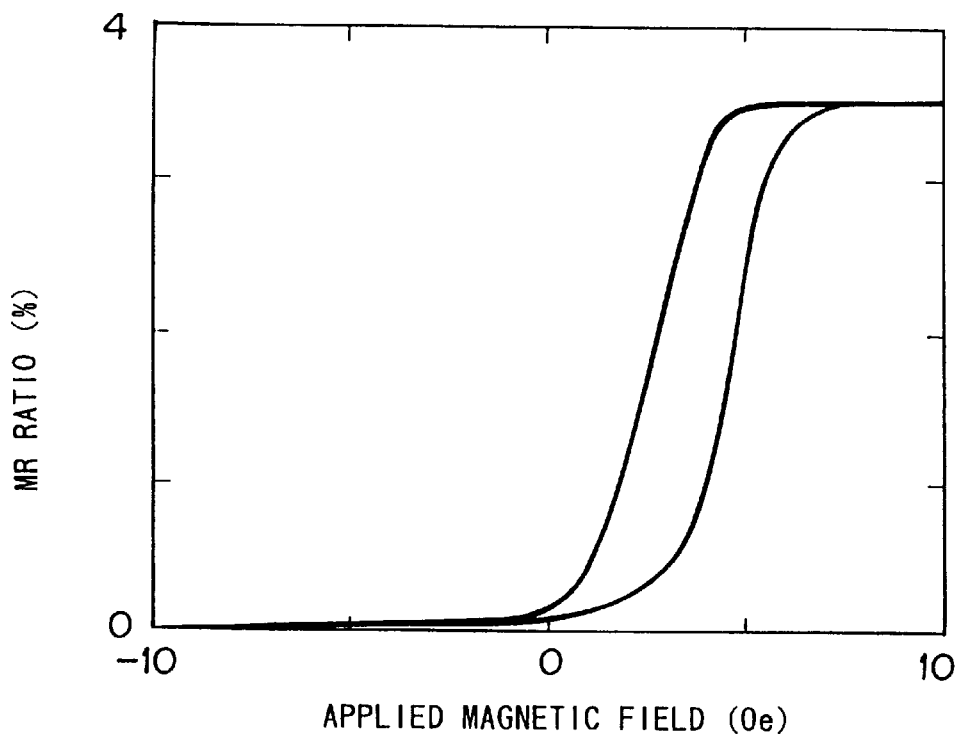
FIG. 12 is a graph showing a minor MR curve of a magnetoresistance effect element (magnetic multilayer film) according to the present invention.

FIG. 11 (A) and (B) respectively show an MR curve and a magnetization curve of the spin-valve magnetic multilayer film forming sample 2-1 of Tale 2. Due to hematite exhibiting antiferromagnetism, the spin of the ferromagnetic layer is pinned so that the laterally asymmetrical spin-valve type MR curve is obtained. Similarly, due to the pinning effect, the magnetization curve is also vertically asymmetrical. FIG. 12 shows a minor loop of the same sample at 10 Oe or less. It is seen that the MR curve rapidly rises up from the zero magnetic field. The maximum hysteresis width at this minor MR loop is small, i.e. 3 Oe, thereby representing the quite excellent characteristic.

Figure 13:
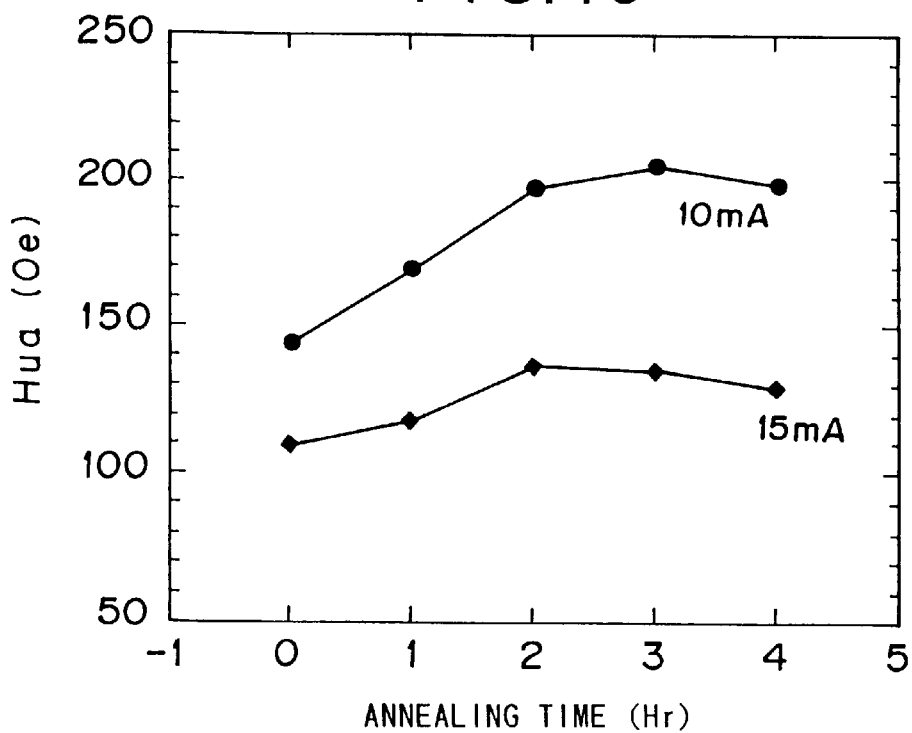
FIG. 13 is a graph showing an influence of heat treatment time upon variation of one-way anisotropic magnetic field in a magnetoresistance effect element (magnetic multilayer film) according to the present invention.

Further, FIG. 13 shows the results of heat treatment of a multi layer film sample of [$\alpha$-Fe$_2$O$_3$ (1,000 Å)—CoNiFe(45 Å)—Cu(88 Å)] formed on a glass substrate. This is a sample where the hematite layer showing antiferromagnetism and the ferromagnetic layer are exchange-coupled with each other. It is confirmed that, as a result of the heat treatment, values of Hua were increased. The improvement in characteristic reaches 50% up during the two-hour heat treatment. Specifically, it is seen that, through the heat treatment, the spin-valve characteristic can be largely improved.

Figure 14:
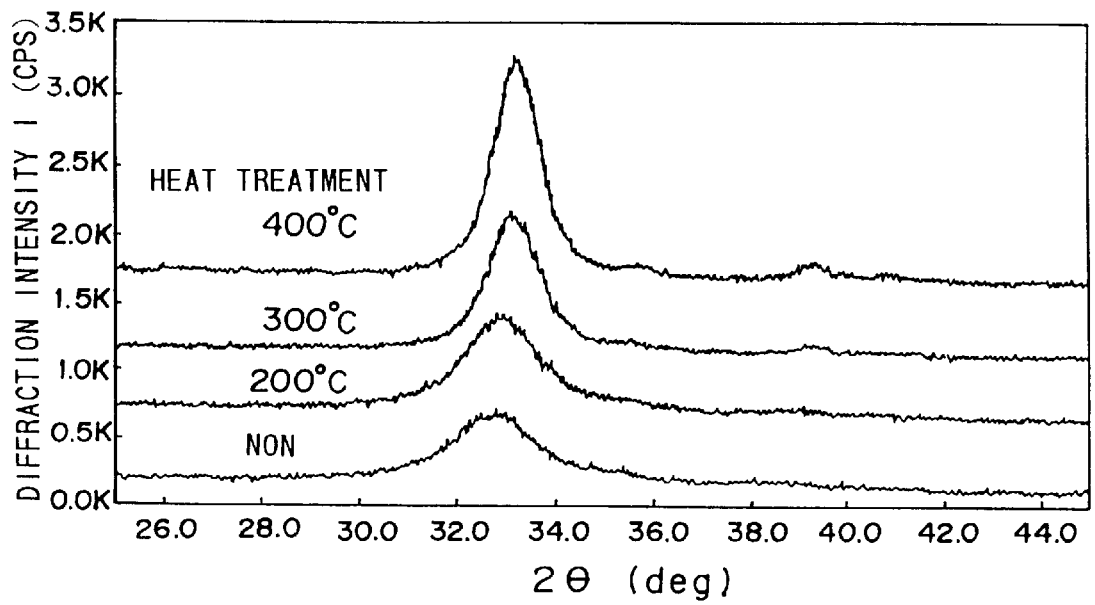
FIG. 14 is a graph showing a relationship between heat treatment time and variation of an X-ray diffraction pattern in a magnetoresistance effect element (magnetic multilayer film) according to the present invention.

FIG. 14 shows a variation of an X-ray diffraction pattern when the substrate was taken out from the film forming apparatus after film formation of iron oxide FeO$_x$, as the pinning layer, on the substrate, and then applied with the heat treatment in the atmosphere. The substrate was held for four hours at temperatures of 200° C., 300° C. and 400° C., respectively, in the order named so as to accumulate the heat treatment. From the results, it is seen that the diffraction peak from the (104) orientation plane of hematite exhibiting antiferromagnetism was clearly increased and crystallization of hematite was advanced. Thereafter, the substrate was again set in the vacuum film forming apparatus to form a film of the spin-valve structure. It was confirmed that, as compared with the sample which was not applied with the heat treatment, a larger MR ratio and a larger Hua were achieved. Accordingly, the heat treatment may be performed at temperature of 100° C. to 300° C. after the film formation of the magnetoresistance effect element, or the heat treatment may be performed at temperature of 100° C. to 300° C. after the formation of at least the pinning layer on the substrate, and thereafter, the spin-valve film (magnetoresistance effect element) may be formed.

Now, as shown in FIG. 18, the concrete example of the invention of the magnetoresistance effect element having the magnetic multilayer film 1, where the oxygen blocking layer 45 is interposed between the pinning layer 50 and the ferromagnetic layer 40, will be described as an example 2.

EXAMPLE 2

A glass substrate was used as the substrate. The glass substrate was placed in a radio-frequency sputtering (RF sputtering) apparatus and, using hematite as a target, an $\alpha$-FeO$_x$, film was formed on the glass substrate as the pinning layer 50. When forming the $\alpha$-FeO$_x$, film, an ultimate pressure was set to $6\times10^{-7}$ Torr to $8\times10^{-7}$ Torr, a pressure upon film formation was set to $7.5\times10^{-3}$ Torr, a substrate temperature was set to about 14° C., and the flow rates of Ar and O$_2$ were changed within the range of 0.5 to 8 sccm. The detailed O$_2$ flow ratios were as shown in Table 3 noted below. The applied power was 150 to 170 W (watt). Under these conditions, after the formation of the $\alpha$-FeO$_x$ film, a Co film as the oxygen blocking layer 45, a NiFe film as the ferromagnetic layer 40 and a Ta (tantalum) as the protective layer were formed. Layer thicknesses of these layers were as shown in Table 3.

A film growth rate of each material was set to about 0.2 to 10 Å/sec. During film formation, sputtering was performed while applying a magnetic field in the plane of the substrate and in a direction parallel to the measurement current. After the film formation of the respective layers, the resultant was cooled from 200° C. under a vacuum of $10^{-5}$ Torr while a magnetic field of 200 Oe was applied in a direction perpendicular to the measurement current and in the in-plane direction, thereby inducing a pinning effect in the ferromagnetic layer. Samples 3-1 to 3-5 of magnetoresistance effect elements shown in Table 3 were prepared in the manner as described above. For each of the samples, the oxidation degree x (=O/Fe) of the $\alpha$-FeO$_x$ film, Hua and the heat-proof temperature were measured. The heat-proof temperature was measured as follows: The sample was kept for an hour under a vacuum of $10^{-6}$ to $10^{-5}$ Torr at temperatures 80° C., 110° C., 140° C., 170° C., 200° C., 250° C. and 300° C., respectively, while applying a magnetic field in the same direction as upon film formation, and thereafter, cooled to the room temperature. Then, magnetization curves of these samples were measured, and a shift amount of the curve from the zero magnetic field, that is, Hua, was estimated. Then, a decreasing curve of Hua was described so as to derive a point from the curve where Hua became 0, which point was determined to be the heat-proof temperature.

The results are shown in Table 3.

TABLE 3

| Sample No. | Laminate Structure | | | | O$_2$Gass Flow Rate (%) | Oxidation Degree X (O/Fe) | Hua (Oe) | Heat Proof Temperature (° C.) |
| | $\alpha$Fe$_2$O$_3$ / | Co / (film thickness (Å)) | NiFe / | Ta | | | | |
|---|---|---|---|---|---|---|---|---|
| 3-1* | (1000. | 5. | 30. | 100) | 0 | 1.33 | 35 | 110 |
| 3-2 | (1000. | 12. | 30. | 100) | 29 | 1.46 | 106 | 240 |
| 3-3 | (1000. | 8. | 22. | 100) | 34 | 1.49 | 116 | 270 |
| 3-4 | (500. | 16. | 25. | 100) | 38 | 1.50 | 89 | 250 |
| 3-5* | (1000. | 6. | 28. | 100) | 47 | — | 38 | 100 |

*outside scope of the present invention (comparative example)
oxidation degree of Sample No. 3–5 unmeasurable due to film quality failure From the results shown in Table 3, it is seen that, by setting the oxygen flow rate in the mixed gas of Ar and O$_2$ to 20 to 40%, a film having an oxidation degree x within a given range can be obtained, and a magnetic multilayer film provided with it has the large Hua and the quite excellent heat resistance. Further, upon examining the X-ray diffraction pattern of the $\alpha$-FeO$_x$ film formed under the radio-frequency sputtering condition of the present invention, only the (104) peak and the (006) peak showing formation of hematite were confirmed.

Further, the experiment was performed to confirm the effect of interposing the oxygen blocking layer 45 between the pinning layer ($\alpha$-FeO$_x$) and the ferromagnetic layer in the present invention. Specifically, the following samples were prepared:

①Sample obtained by forming, on the substrate, a 1,000 Å-thickness $\alpha$-Fe$_2$O$_3$ film, a 5 Å-thickness Co film (oxygen blocking layer), a 95 Å-thickness NiFe film and a 100 Å-thickness Ta film in the order named.

②Sample obtained by forming, on the substrate, a 1,000 Å-thickness $\alpha$-Fe$_2$O$_3$ film, a 10 Å-thickness Co film (oxygen blocking layer), a 90 Å-thickness NiFe film and a 100 Å-thickness Ta film in the order named.

③Sample obtained by forming, on the substrate, a 1,000 Å-thickness $\alpha$-Fe$_2$O$_3$ film, a 100 Å-thickness NiFe film and a 100 Å-thickness Ta film in the order named.

Each sample was applied with heat treatment under various temperature conditions, and relative change of one-way exchange anisotropy energy J at an interface of the pinning layer ($\alpha$-FeO$_x$) was derived using the state upon film formation as a reference. Specifically, each sample was applied with the heat treatment for one hour in a vacuum of $5\times10^{-6}$ to $20\times10^{-6}$ Torr at temperatures 150° C., 200° C., 250° C. and 300° C., respectively, and relative change of the one-way exchange anisotropy energy J after the heat treatment at each temperature was examined. The one-way exchange anisotropy energy J is expressed by J=Hua·Ms·d and represents a magnitude of exchange coupling at the antiferromagnetic layer. Hua represents one-way anisotropy, Ms represents a saturation magnetization amount of the ferromagnetic layer, and d represents a film thickness of the ferromagnetic layer.

Figure 19:
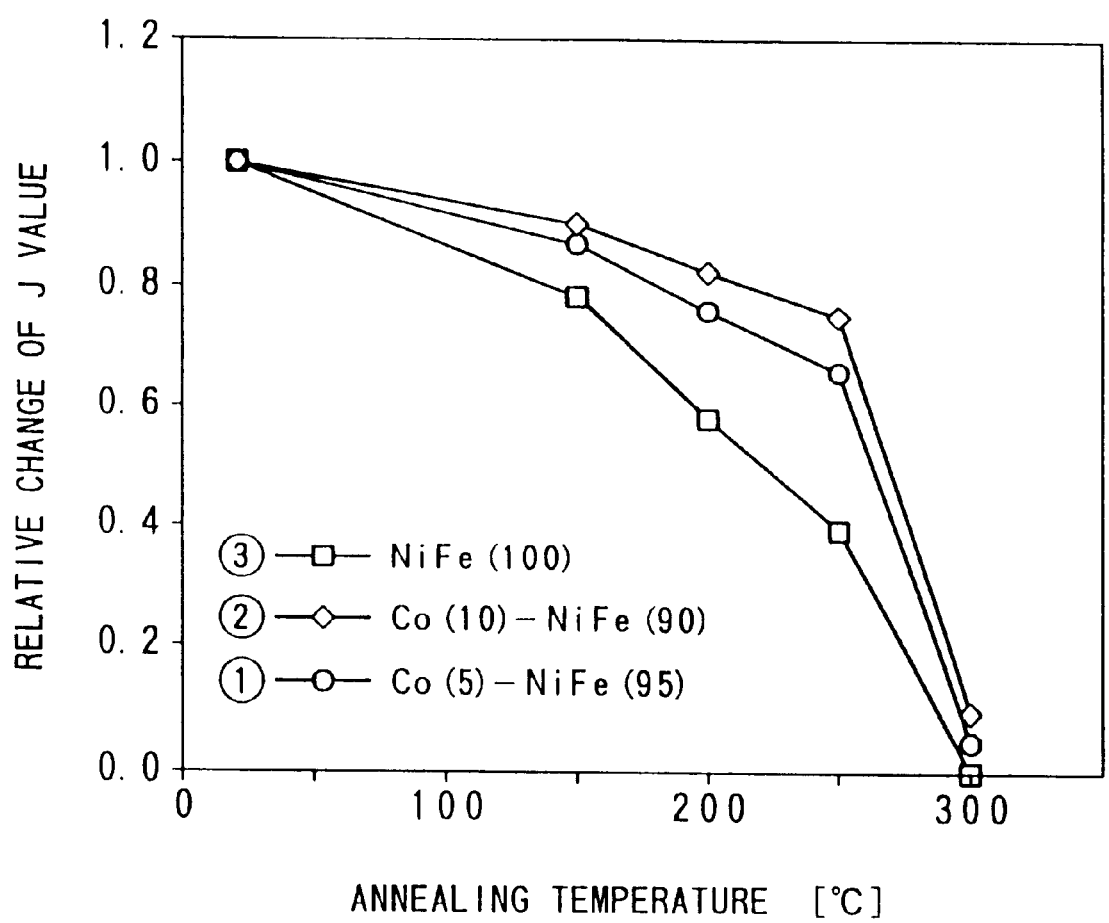
FIG. 19 is a graph showing a relationship between annealing temperatures (heat treatment temperatures) and relative change of J values in magnetic multilayer film samples.

The results are shown in a graph of FIG. 19. As seen from the graph shown in FIG. 19, the samples with the interposed Co film (oxygen blocking layer) maintained the sufficient characteristic even in the heat treatment at 250° C. On the contrary, in the sample where the NiFe film was formed directly on the $\alpha$-Fe$_2$O$_3$ film without interposing the Co film (oxygen blocking layer), deterioration of the characteristic was already observed in the heat treatment at 150° C.

Figure 20:
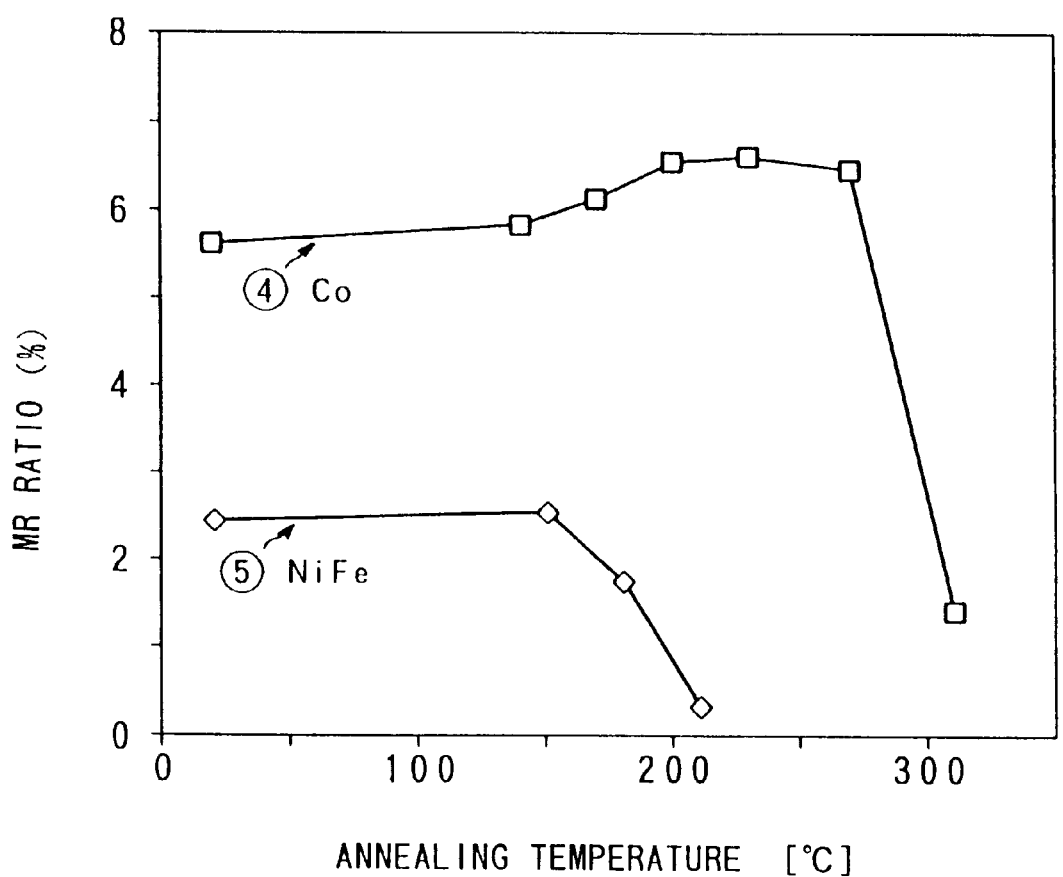
FIG. 20 is a graph showing a relationship between annealing temperatures (heat treatment temperatures) and MR ratios in magnetoresistance effect element (magnetic multilayer film) samples.

Further, two kinds of magnetic multilayer film samples exhibiting the spin-valve characteristic were prepared, and a relationship between the heat treatment temperature and the MR ratio were examined for these samples. The results are shown in FIG. 20. The following samples were used:

④Sample obtained by forming, on the substrate, a 1,000 Å-thickness $\alpha$-Fe$_2$O$_3$ film, a 20 Å-thickness Co film (having both functions of an oxygen blocking layer and a ferromagnetic layer), a 25 Å-thickness Cu film (non-magnetic metal layer), a laminate body (soft magnetic layer) of a 10 Å-thickness Co film and a 50 Å-thickness NiFe film, a 20 Å-thickness Co film and a 100 Å-thickness Ta film in the order named.

⑤Sample obtained by forming, on the substrate, a 1,000 Å-thickness $\alpha$-Fe$_2$O$_3$ film, a 38 Å-thickness NiFe film (ferromagnetic layer), a 27 Å-thickness Cu film (non-magnetic metal layer), a 77 Å-thickness NiFe film (soft magnetic layer) and a 30 Å-thickness Cu film in the order named.

In this case, each sample was applied with heat treatment (annealing treatment) for 15 minutes under a vacuum of $5\times10^{-6}$ to $20\times10^{-6}$ Torr at respective given temperatures, respectively. As seen from a graph shown in FIG. 20, in the sample using the Co film having both functions of the oxygen blocking layer and the ferromagnetic layer, deterioration of the MR characteristic was hardly observed even in the heat treatment at 250° C. On the other hand, in the sample using no Co film, but instead, having the NiFe ferromagnetic film, the MR ratio was largely reduced in the heat treatment no less than 150° C. Further, it is seen from FIG. 20 that, by using the Co film having both functions of the oxygen blocking layer and the ferromagnetic layer instead of the NiFe ferromagnetic layer, the MR ratio was increased about three times. Thus, if this material is used as a material of the reading MR head for the ultrahigh density magnetic recording, a large merit is achieved.

Next, various kinds of magnetic multilayer films were prepared using the pinning layer 50 of the $\alpha$-FeO$_x$ film as described above to exhibit the spin-valve type MR change, and given characteristics thereof were examined as shown in Table 4 noted below.

TABLE 4

| Sample No. | Laminate Structure $\alpha$Fe$_2$O$_3$ / Co / NiFe / Cu / Co / NiFe (film thickness (Å)) | | | | | | O$_2$ Gass Flow Rate (%) | Oxidation Degree X (O/Fe) | Just After Film Formation | | After 250° C. Heat Treatment | |
|---|---|---|---|---|---|---|---|---|---|---|---|---|
| | | | | | | | | | MR (%) | High-Frequency Slope Slope (1 MHz, (%/Oe) %/Oe) | MR (%) | High-Frequency Slope Slope (1 MHz, (%/Oe) %/Oe) |
| 4-1* | (1000. | 4. | 25. | 25. | 0. | 80) | 5 | 1.35 | 3.2 | 1.1  1.0 | 1.8 | 0.6  0.4 |
| 4-2 | (1000. | 6. | 20. | 25. | 8. | 60) | 20 | 1.44 | 5.4 | 1.7  1.6 | 5.3 | 1.5  1.4 |
| 4-3 | (800. | 8. | 22. | 23. | 6. | 66) | 28 | 1.47 | 5.5 | 1.4  1.3 | 5.6 | 1.5  1.3 |
| 4-4 | (500. | 18. | 0. | 25. | 8. | 50) | 30 | 1.46 | 6.6 | 1.3  1.1 | 6.4 | 1.2  1.0 |
| 4-5 | (1000. | 10. | 18. | 28. | 8. | 55) | 38 | 1.48 | 5.1 | 1.6  1.5 | 4.8 | 1.3  1.2 |
| 4-6* | (1000. | 10. | 18. | 28. | 8. | 55) | 50 | — | 3.3 | 1.0  0.8 | 1.9 | 0.6  0.4 |

*outside scope of the present invention (comparative example)
oxidation degree of Sample No. 4–6 unmeasurable due to film quality failure In Table 4, for example, sample 4-2 was formed of [$\alpha$-Fe$_2$O$_3$ (1,000)—Co(6)—NiFe(20)—Cu(25)—Co(8)—NiFe(60)], and it was a magnetic multilayer film formed by disposing, from the side of the substrate, a 1,000 Å-thickness $\alpha$-Fe$_2$O$_3$ antiferromagnetic layer (pinning layer), a 6 Å-thickness Co layer used as the oxygen blocking layer, a 20 Å-thickness NiFe (Ni$_{81}$Fe$_{19}$:weight %) layer used as the ferromagnetic layer, a 25 Å-thickness Cu non-magnetic metal layer and a laminate body, used as the soft magnetic layer, of an 8 Å-thickness Co layer and a 60 Å-thickness NiFe (Ni$_{81}$Fe$_{19}$:weight %) layer. In the following examples, if not particularly referred to, NiFe represents Ni$_{81}$Fe$_{19}$ (weight %).

In Table 4, an item of $O_2$ gas flow ratio (%) represents a condition of the gas atmosphere of radio-frequency sputtering upon formation of the $\alpha$-$Fe_2O_3$ layer, and the oxidation degree x (=O/Fe) represents an actually measured oxidation degree of the $\alpha$-$Fe_2O_3$ layer. The estimation items shown in Table 4 are substantially the same as those in the foregoing Table 2, except that Table 4 further includes data after heat treatment at 250° C.

It is seen from the results shown in Table 4, it is seen that, by fully realizing the characteristic of antiferromagnetism of iron oxide $FeO_x$ forming the pinning layer and by selecting materials and thicknesses of the ferromagnetic layer (including the blocking layer), the soft magnetic layer and the non-magnetic metal layer from the ranges disclosed in the present invention, the magnetoresistance effect element can be realized wherein the slope of the magnetoresistance change at 6 Oe under the high-frequency magnetic field of 1 MHz is 0.7%/Oe or greater. In addition, it is seen that the magnetoresistance effect element in the scope of the present invention is small in characteristic change after the heat treatment at 250° C. and thus quite excellent in heat resistance.

Further, as examples of the invention of the MR head as the magnetoresistance device and a comparative example, the following examples 3 to 5 and comparative example 1 will be shown.

EXAMPLE 3

On an AlTiC substrate, FeAlSi (Sendust) was formed into a film (corresponding to the numeral 300 at the lower part in FIG. 4) with a thickness of 2 $\mu$m as a layer corresponding to the lower shield, then $Al_2O_3$ was formed thereon into a film of 1,500 Å in thickness as an insulating layer (gap film), and then $\alpha$-$Fe_2O_3$ (1,000 Å)—CoNiFe (26 Å)—Cu(24 Å)—NiFeCo(86 Å) were formed thereon in the order named, so as to form a spin-valve magnetic multilayer film. The film forming condition was that an ultimate pressure was set to $2.3\times10^{-7}$ Torr, a pressure upon film formation was set to $1.4\times10^{-4}$ Torr and a substrate temperature was set to about 14° C. The film formation of each material was performed by the ion beam sputtering method at a film growth rate of 0.2 to 0.3 Å/sec while applying a magnetic field in the plane of the substrate and in a direction parallel to a measuring current.

Figure 15:
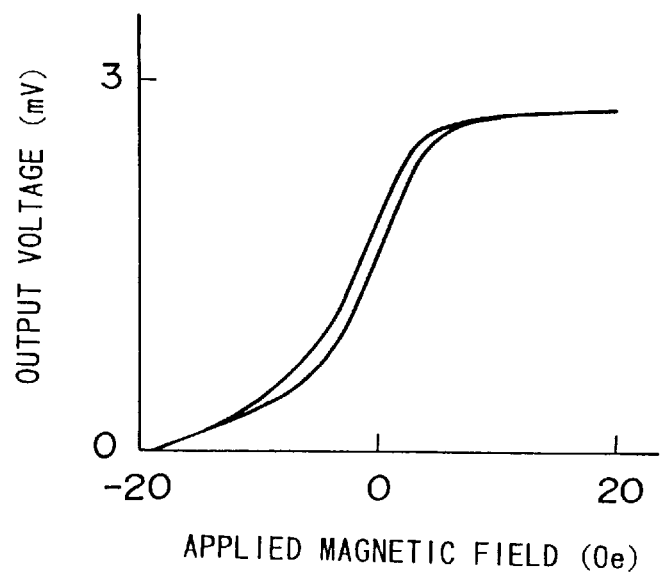
FIG. 15 is a chart showing applied magnetic fields and output voltages of a magnetoresistance device (MR head) according to the present invention.

Thereafter, a pattern of 20$\mu$m×6 $\mu$m was formed as a magnetically-sensitive portion using a photolithography technique, and an electrode having a track width of 3 $\mu$m was formed thereon. Then, $Al_2O_3$ was formed thereon into a film of 1,500 Å in thickness as an insulating layer (gap film). Further, an NiFe (Permalloy) upper shield layer (corresponding to the numeral 300 at the upper part in FIG. 4) was formed thereon into a thickness of 2 $\mu$m so as to form an MR head. Thereafter, it was cooled from 180° C. under a vacuum of $10^{-5}$ Torr while applying a magnetic field of 200 Oe in a direction perpendicular to the measurement current direction and in the in-plane direction, thereby inducing the pinning effect in the ferromagnetic layer. FIG. 15 shows a variation of the output voltage obtained when the measurement current was set to 5 mA and the external magnetic field was varied in the range of ±20 Oe at 50 Hz. According to the MR head using the artificial lattice magnetic multilayer film of the present invention, the output voltage of about 830 $\mu$V/$\mu$m, as expressed by a standard output voltage per unit track width, was obtained.

COMPARATIVE EXAMPLE 1

An MR head employing the anisotropic magnetoresistance effect which has been hitherto used was prepared as a comparative example 1 with permalloy under the same condition as the example 3. The measurement current was set to 5 mA and the external magnetic field was varied in the range of 20 Oe at 50 Hz. The output voltage at this time was about 170 $\mu$V/$\mu$m.

From the comparison between the example 3 and the comparative example 1, the MR head of the present invention can obtain about five times as high as the output of the conventional example. Accordingly, the effect of the present invention is distinct.

EXAMPLE 4

Figure 16:
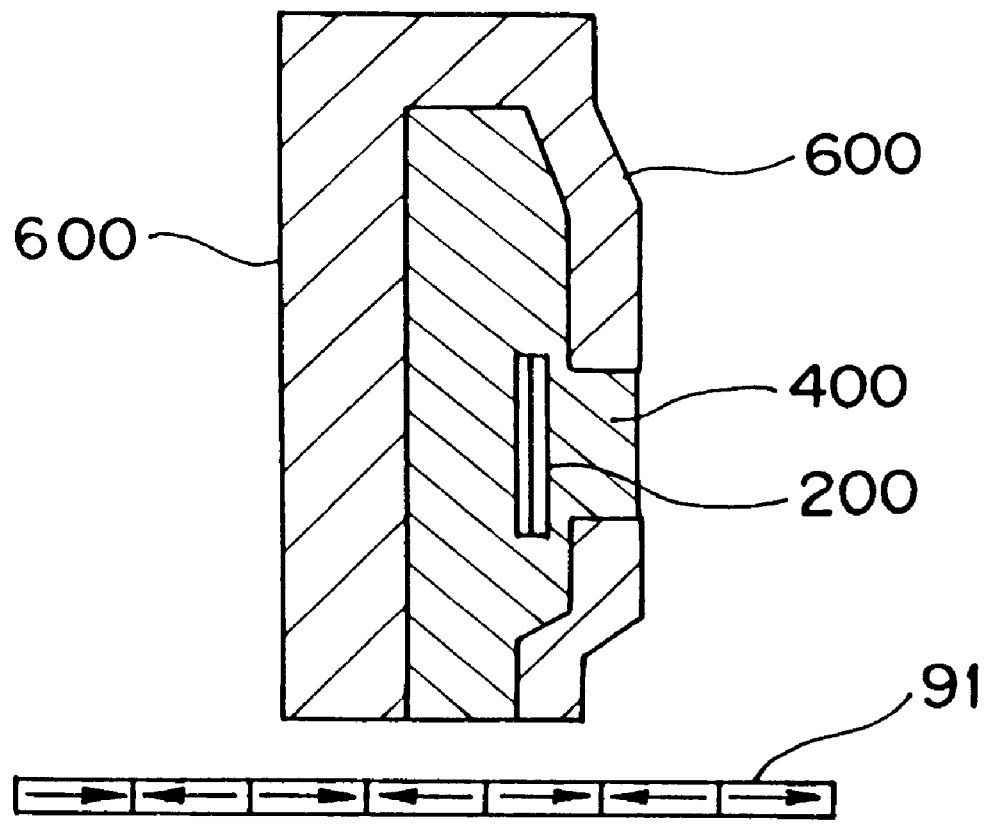
FIG. 16 is a partially omitted sectional view showing an example, wherein a magnetoresistance effect element (magnetic multilayer film) according to the present invention is applied to a yoke-type MR head.

Furthermore, FIG. 16 shows an example in which the magnetoresistance effect element of the present invention is applied to a yoke type MR head. In this example, a part of yokes 600, 600 for guiding magnetic flux is provided with a cut-out portion, and a magnetoresistance effect element 200 is formed through a thin insulating film 400 therebetween. The magnetoresistance effect element 200 is provided with an electrode (not shown) through which an electric current flows in a direction parallel or perpendicular to the direction of a magnetic path formed by the yokes 600, 600. As the result, the output which was two times as high as that of the MR head using permalloy was obtained. In the magnetic multilayer film of the present invention, the rise-up characteristic at the zero magnetic field is excellent, and thus a shunt layer and a bias magnetic field applying means which are usually used, may not be provided.

EXAMPLE 5

Figure 17:
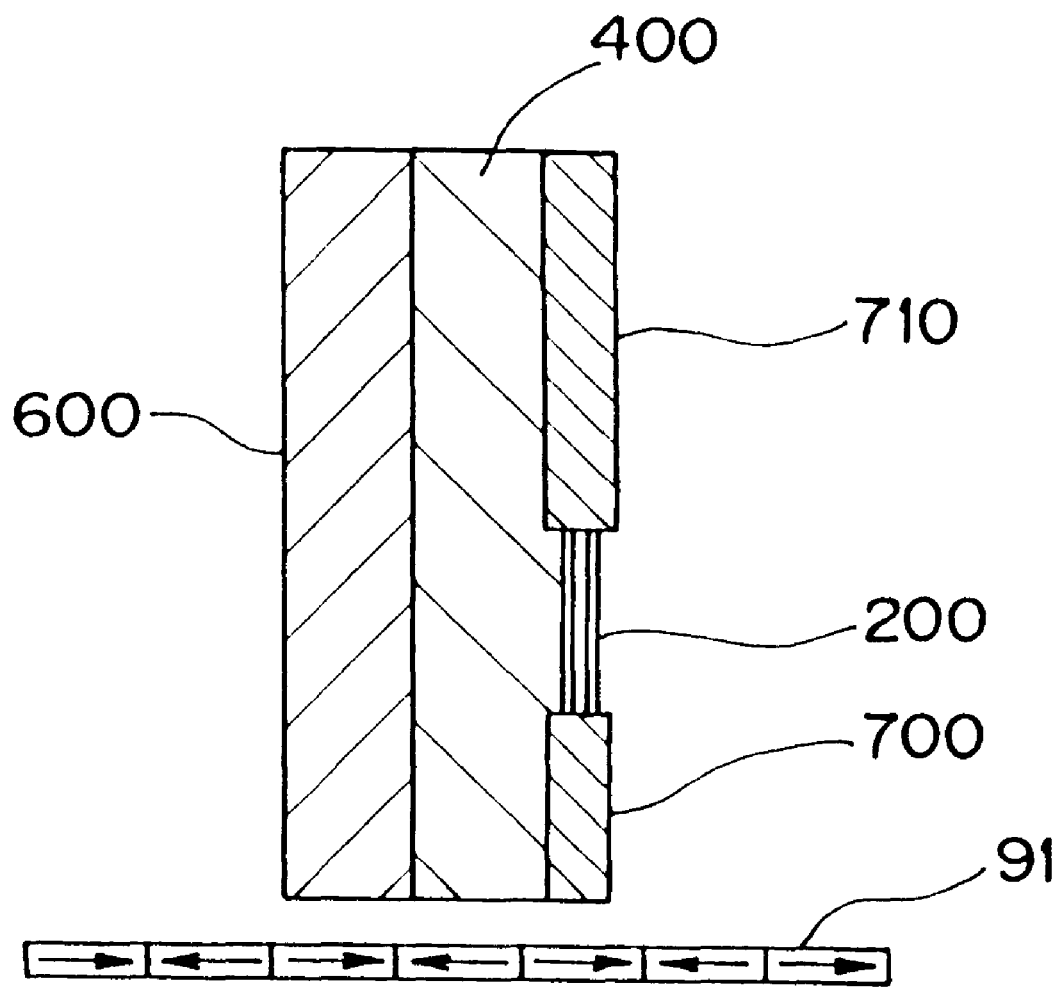
FIG. 17 is a partially omitted sectional view showing an example, wherein a magnetoresistance effect element (magnetic multilayer film) according to the present invention is applied to a flux guide type MR head.

FIG. 17 shows another example in which a magnetoresistance device, for example, an MR head is constructed by the magnetoresistance effect element of the present invention. The magnetoresistance effect element 200 is formed in contact with high-resistivity flux guide layers 700, 710 magnetically. The flux guide layers are formed of material whose resistivity is three times or more as high as the resistivity of the magnetic multilayer film 200, so that substantially no measurement current flowing in the magnetic multilayer film 200 flows in the flux guide layers 700, 710. On the other hand, since the flux guide layers 700 and the magnetic multilayer film 200 are magnetically contacted with each other, the signal magnetic field is guided to the flux guide layer 700 and reaches the magnetic multilayer film 200 without losing its intensity. Reference numeral 600 represents another different flux guide layer, and it acts as a return guide for magnetic flux passing through the magnetic multilayer film 200. This flux guide layer 600 may be provided at each of both sides of the magnetoresistance effect element 200 and the pair of the high-resistivity flux guide layers 700, 710. Furthermore, the guide layers 710 and 600 may be contacted with the medium at a remote end portion. At this time, the output was confirmed as being three times as large as that of an MR head using permalloy. In the drawing, reference numeral 400 represents a non-magnetic insulating layer.

As described above, according to the present invention on the magnetoresistance effect element, by employing iron oxide $FeO_x$ exhibiting antiferromagnetism as the pinning layer, the spin-valve type magnetoresistance effect element can be obtained which is particularly excellent in corrosion resistance and has a magnetoresistance ratio with an MR slope no less than 0.7%/Oe in the region of the high-frequency magnetic field of 1 MHz. Further, the rise-up characteristic of the MR curve at the zero magnetic field is extremely excellent with small hysteresis, and it has high heat resistance. The heat resistance is further improved by interposing the oxygen blocking layer between the pinning layer and the ferromagnetic layer. In the magnetoresistance device, for example, the MR head, using the magnetoresistance effect element having the magnetic multilayer film, the output voltage is approximately five times as high as that of the conventional material. Accordingly, there can be provided an excellent MR head which has extremely high reliability and enables the reading for ultrahigh density magnetic recording exceeding 1 Gbit/inch$^2$.

Industrial Applicability

The magnetoresistance device according to the present invention is used for reading the magnetic signal, from the medium, magnetically recorded with the ultrahigh density and forms a part of technique supporting further accelerating densification of the hard disk drive.

We claim:

1. A magnetoresistance device comprising a magnetoresistance effect element, conductive films and electrode portions, wherein said conductive films are conductively connected to said magnetoresistance effect element through said electrode portions, and said magnetoresistance effect element comprises a magnetic multilayer film including a non-magnetic metal layer, a ferromagnetic layer formed on one surface of the non-magnetic metal layer, a soft magnetic layer formed on the other surface of said non-magnetic metal layer, and a pinning layer which is formed on (a surface opposite to a surface abutting the non-magnetic metal layer) said ferromagnetic layer to pin a direction of magnetization of said ferromagnetic layer, and wherein said pinning layer is formed of $FeO_x$ ($1.35 \leq x \leq 1.55$, unit: atomic ratio).

2. A magnetoresistance device as claimed in claim 1, wherein said magnetoresistance effect element comprises a substrate from which said pinning layer, said ferromagnetic layer, said non-magnetic metal layer and said soft magnetic layer are laminated successively.

3. A magnetoresistance device as claimed in claim 1, wherein a thickness of said pinning layer is set to 100 to 3000 Å.

4. A magnetoresistance device as claimed in claim 1, wherein said pinning layer is formed of $\alpha\text{-}Fe_2O_3$ (hematite) exhibiting antiferromagnetism.

5. A magnetoresistance device as claimed in claim 1, wherein said pinning layer contains $\alpha\text{-}Fe_2O_3$ (hematite) exhibiting antiferromagnetism at least no less than 30 volume % and no more than 60 volume %.

6. A magnetoresistance device as claimed in claim 1, wherein said pinning layer is formed of an aggregate of microcrystals, no greater than 100 Å, of $\alpha\text{-}Fe_2O_3$ (hematite) exhibiting antiferromagnetism.

7. A magnetoresistance device as claimed in claim 1, wherein said pinning layer exhibits antiferromagnetism and its Neel temperature is 120° C. to 400° C.

8. A magnetoresistance device as claimed in claim 1, wherein said pinning layer is a film formed by sputtering a target of iron oxide by an ion beam sputtering method while applying an assist beam of mixed gas of Ar and $O_2$ relative to the substrate.

9. A magnetoresistance device as claimed in claim 8, wherein said assist beam is within ranges of an accelerating voltage 60 to 150 eV, an ion current 4 to 15 mA, Ar:$O_2$ flow ratio 1:1 to 9:1 and an Ar+$O_2$ flow rate 6 to 20 sccm.

10. A magnetoresistance device as claimed in claim 1, wherein said pinning layer is a film formed by sputtering a target of iron oxide in an atmosphere of mixed gas of Ar and oxygen using a radio-frequency sputtering method while adjusting an oxygen gas flow rate upon film formation to 20 to 40% relative to a total gas flow rate.

11. A magnetoresistance device as claimed in claim 1, wherein said ferromagnetic layer has a composition represented by $(Co_zNi_{1-z})_wFe_{1-w}$ ($0.4 \leq z \leq 1.0$, $0.5w \leq 1.0$ by weight), and said soft magnetic layer has a composition represented by $(Ni_xFe_{1-x})_yCo_{1-y}$ ($0.7 \leq x \leq 0.9$, $0.1 \leq y \leq 0.5$ by weight).

12. A magnetoresistance device as claimed in claim 1, wherein said ferromagnetic layer has a composition represented by $(Co_zNi_{1-z})_wFe_{1-w}$ ($0.4 \leq z \leq 1.0$, $0.5 \leq w \leq 1.0$ by weight), and said soft magnetic layer has acomposition represented by $Co_tM_uM'_qB_r$ ($0.6 \leq t \leq 0.95$, $0.01 \leq u \leq 0.2$, $0.01 \leq q \leq 0.1$, $0.05 \leq r \leq 0.3$ by atomic ratio; M represents at least one material selected from Fe and Ni, and M' represents at least one material selected from Zr, Si, Mo and Nb).

13. A magnetoresistance device as claimed in claim 1, wherein said non-magnetic metal layer is formed of a material containing at least one material selected from Au, Ag and Cu.

14. A magnetoresistance device as claimed in claim 1, wherein said magnetoresistance effect element shows a spin-valve type magnetoresistance change due to magnetization of said ferromagnetic layer pinned by said pinning layer.

15. A magnetoresistance device as claimed in claim 1, wherein said magnetoresistance effect element has a slope of magnetoresistance change which is 0.7%/Oe or more at a width of 6 Oe under high-frequency magnetic field of 1 MHz.

16. A magnetoresistance device as claimed in claim 1, wherein said magnetoresistance device is a magnetoresistance effect type head.

17. A magnetoresistance device as claimed in claim 16, wherein both end portions of said magnetoresistance effect element are coupled to said electrode portions so that the whole end portions thereof are contacted with said electrode portions.

18. A magnetoresistance device as claimed in claim 16, further comprising linking soft magnetic layers between said magnetoresistance effect element and said electrode portions which are formed at both end portions of said magnetoresistance effect element, wherein said linking soft magnetic layers and the whole end portions of said magnetoresistance effect element are in abutment with each other.

19. A magnetoresistance device as claimed in claim 16, wherein said linking soft magnetic layer is continuously formed between said magnetoresistance effect element and each of said electrode portions formed at both end portions of said magnetoresistance effect element and in contact with a lower surface of said electrode portion.

20. A magnetoresistance device as claimed in claim 16, which has no biasing magnetic field applying mechanism.

21. A magnetoresistance device as claimed in claim 1, wherein said ferromagnetic layer is formed while applying an external magnetic field of 10 to 300 Oe in the same direction as a signal magnetic field and in a film in-plane direction upon film formation, and said soft magnetic layer is formed while applying an external magnetic field of 10 to 300 Oe in a direction perpendicular to the direction of the signal magnetic field and in a film in-plane direction upon film formation.

22. A magnetoresistance device as claimed in claim 1, wherein said laminated magnetoresistance effect element is applied with a heat treatment at a temperature of 100° C. to 300° C.

23. The magnetoresistance device as claimed in claim 1, wherein said magnetoresistance effect element is applied with a heat treatment at a temperature of 100° C. to 300° C. after at least said pinning layer is formed on the substrate.

24. A magnetoresistance device comprising a magnetoresistance effect element, conductive films and electrode portions, wherein said conductive films are conductively connected to said magnetoresistance effect element through said electrode portions, wherein said magnetoresistance effect element has a substrate on which a pinning layer for pinning a direction of magnetization of a ferromagnetic layer, said ferromagnetic layer, a non-magnetic metal layer and a soft magnetic layer are laminated successively, and wherein said pinning layer is formed of $FeO_x$ ($1.35 \leq x \leq 1.55$, unit: atomic ratio) and an oxygen blocking layer formed of Co or an alloy containing Co no less than 80 weight % and having a thickness of 4 to 30Å is interposed between said pinning layer and said ferromagnetic layer.

25. A magnetoresistance device as claimed in claim 24, wherein a thickness of said pinning layer is set to 100 Å to 3,000 Å.

26. A magnetoresistance device as claimed in claim 24, wherein said pinning layer is formed of $\alpha$-$Fe_2O_3$ (hematite) exhibiting antiferromagnetism.

27. A magnetoresistance device as claimed in claim 24, wherein said pinning layer contains $\alpha$-$Fe_2O_3$ (hematite) exhibiting antiferromagnetism at least no less than 30 volume % and no more than 60 volume %.

28. A magnetoresistance device as claimed in claim 24, wherein said pinning layer is formed of an aggregate of microcrystals, no greater than 100Å, of $\alpha$-$Fe_2O_3$ (hematite) exhibiting antiferromagnetism.

29. A magnetoresistance device as claimed in claim 24, wherein said pinning layer exhibits antiferromagnetism and its Neel temperature is 120° C. to 400° C.

30. A magnetoresistance device as claimed in claim 24, wherein said pinning layer is a film formed by sputtering a target of iron oxide by an ion beam sputtering method while applying an assist beam of mixed gas of Ar and $O_2$ relative to the substrate.

31. A magnetoresistance device as claimed in claim 30, wherein said assist beam is within ranges of an accelerating voltage 60 to 150 eV, an ion current 4 to 15 mA, Ar:$O_2$ flow ratio 1:1 to 9:1 and an Ar+$O_2$ flow rate 6 to 20 sccm.

32. A magnetoresistance device as claimed in claim 24, wherein said pinning layer is a film formed by sputtering a target of iron oxide in an atmosphere of mixed gas of Ar and oxygen using a radio-frequency sputtering method while adjusting an oxygen gas flow rate upon film formation to 20 to 40% relative to a total gas flow rate.

33. A magnetoresistance device as claimed in claim 24, wherein said ferromagnetic layer has a composition represented by $(Co_zNi_{1-z})_wFe_{1-w}$ ($0.4 \leq z \leq 1.0$, $0.5 \leq w \leq 1.0$ by weight).

34. A magnetoresistance device as claimed in claim 24, wherein said ferromagnetic layer has the same composition as said oxygen blocking layer.

35. A magnetoresistance device as claimed in claim 24, wherein said soft magnetic layer is a laminate body including, from said non-magnetic layer, a first soft magnetic layer formed of Co or an alloy containing Co no less than 80 weight %, and a second soft magnetic layer having a composition represented by $(Ni_zFe_{1-x})_yCo_{1-y}$ ($0.7 \leq x \leq 0.9$, $0.1 \leq y \leq 0.5$ by weight).

36. A magnetoresistance device as claimed in claim 24, wherein said non-magnetic metal layer is formed of a material containing at least one material selected from Au, Ag and Cu.

37. A magnetoresistance device as claimed in claim 24, wherein said magnetoresistance effect element shows a spin-valve type magnetoresistance change due to magnetization of said ferromagnetic layer pinned by said pinning layer.

38. A magnetoresistance device as claimed in claim 24, wherein said laminated magnetoresistance effect element is applied with a heat treatment at a temperature of 100° C. to 300° C.

39. A magnetoresistance device as claimed in claim 24. wherein said magnetoresistance effect element has a slope magnetoresistance change which is 0.7%/Oe or more at a of 6 Oe under high-frequency magnetic field of 1 MHz.

* * * * *